United States Patent
Minamino et al.

(10) Patent No.: US 6,917,482 B2
(45) Date of Patent: Jul. 12, 2005

(54) OPTICAL MODULE MOUNTED BODY AND SECURING METHOD OF OPTICAL MODULE

(75) Inventors: Masayuki Minamino, Tokyo (JP); Takashi Koseki, Tokyo (JP); Toru Fukushima, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/646,773

(22) Filed: Aug. 25, 2003

(65) Prior Publication Data

US 2004/0052478 A1 Mar. 18, 2004

(30) Foreign Application Priority Data

Aug. 29, 2002 (JP) ......................................... 2002-250753
Aug. 29, 2002 (JP) ......................................... 2002-250754

(51) Int. Cl.$^7$ .............................................. G02B 7/02
(52) U.S. Cl. ........................ 359/819; 359/811; 359/821; 359/822
(58) Field of Search ................................. 359/819, 811, 359/821, 820, 822, 814

(56) References Cited

U.S. PATENT DOCUMENTS

| | | | |
|---|---|---|---|
| 6,522,486 B2 | | 2/2003 | Furuhashi et al. |
| 6,608,725 B2 | * | 8/2003 | Izawa et al. ................. 359/811 |
| 2001/0038498 A1 | * | 11/2001 | Furuhashi et al. .......... 359/819 |
| 2002/0149861 A1 | * | 10/2002 | Yonemura .................... 359/808 |

* cited by examiner

Primary Examiner—Ricky Mack
Assistant Examiner—Brandi Thomas
(74) Attorney, Agent, or Firm—Oblon, Spivak, McClelland, Maier & Neustadt, P.C.

(57) ABSTRACT

An improved optical module mounted body is disclosed. The optical module mounted body comprising: a mounting board having a mounting surface with a plurality of holes formed thereon; an optical module placed on the mounting surface; and a securing member configured to secure the optical module, the securing member including an upper portion, a plurality of legs extending from the upper portion and a plurality of engagement portions formed at ends of the plurality of legs, wherein the optical module is held between the mounting board and the securing member such that the upper portion of the securing member abuts on an upper surface of the optical module, and wherein the plurality of legs are inserted in the plurality of holes, the plurality of engagement portion engaging with the mounting board.

16 Claims, 19 Drawing Sheets

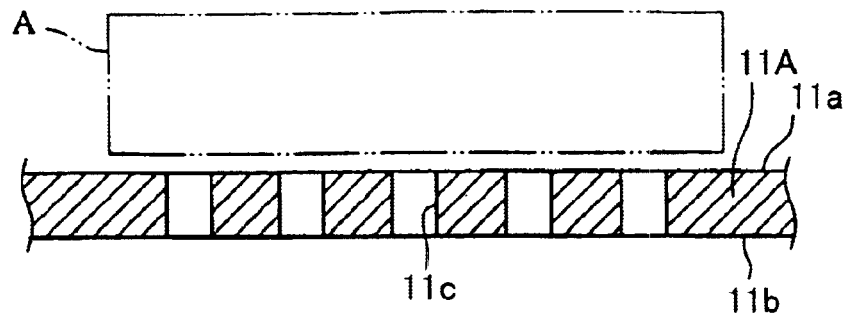
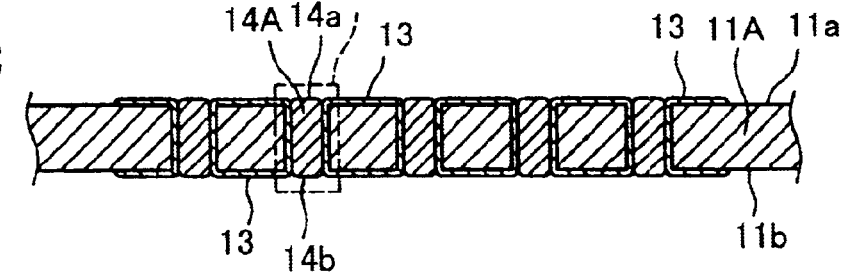
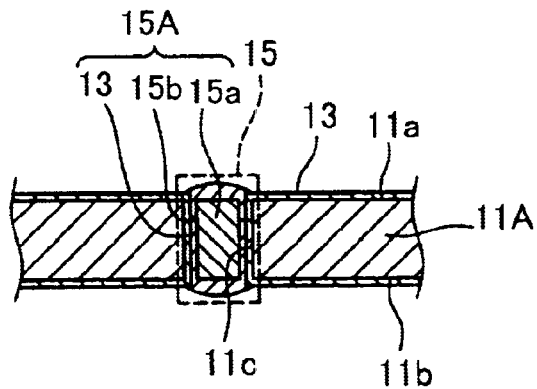

OPTICAL MODULE MOUNTED BODY AND SECURING METHOD OF OPTICAL MODULE

BACKGROUND OF THE INVENTION

1. Field of the Invention

The present invention relates to an optical module mounted body and a method of securing an optical module to a mounting board.

2. Related Art

Optical modules having an optical semiconductor element such as a semiconductor laser diode (hereinafter referred to as LD) are generally mounted on a mounting board formed with a predetermined wiring patterns.

FIG. 1-16 shows an example of the optical module mounted on a mounting board, which is disclosed in U.S. Pat. No. 6,522,486.

In this prior art, the optical module is placed directly on a mounting board. A securing member is placed over a package of the optical module and fastened to the mounting board by use of screws on the bottom end flanges of the securing member. The optical module is held between the securing member and the mounting board, thereby fixedly pressed against the mounting board. The heat generated by an LD inside the optical module is dissipated through a bottom face of the package to the mounting board and ultimately into the air.

In this securing method of the optical module, however, if a turning torque of the screws is not sufficient, the optical module and the mounting board are not in properly close contact with each other, while if the torque is excessive, the mounting board or the securing member may be deformed or damaged, leading also to an improper contact. Thus, a reduced heat transferring efficiency between the optical module and the mounting board results in both cases.

It is for this reason that the prior art requires a turning torque of the screws to be strictly controlled.

In addition, the prior art securing method requires flanges at which the securing member is fastened to the mounting board. Those flanges project beyond the main body and inevitably occupy some space on the mounting board. However, the package should be free of such flanges in pursuing downsizing of the optical module and of the mounting board mounted with the optical module.

Further, in adopting an easy method of securing the optical module to a mounting board, a care should be paid to ensure or to enhance the heat dissipation from the LD to the mounting board.

SUMMARY OF THE INVENTION

In general, in one aspect, the present invention relates to an optical module mounted body. The optical module mounted body comprising: a mounting board having a mounting surface with a plurality of holes formed thereon; an optical module placed on the mounting surface; and a securing member configured to secure the optical module, the securing member including an upper portion, a plurality of legs extending from the upper portion and a plurality of engagement portions formed at ends of the plurality of legs, wherein the optical module is held between the mounting board and the securing member such that the upper portion of the securing member abuts on an upper surface of the optical module, and wherein the plurality of legs are inserted in the plurality of holes, the plurality of engagement portion engaging with the mounting board.

In general, in one aspect, the present invention relates to a securing method of an optical module. The securing method of an optical module comprising: placing the optical module on a mounting surface of a mounting board; placing a securing member over the optical module, the securing member including an upper portion to abut on an upper surface of the optical module, a plurality of legs extending from the upper portion generally alongside of the optical module, and a plurality of engagement portions being formed at ends of the plurality of legs; and attaching the securing member to the mounting board, the plurality of legs being inserted in a plurality of holes formed on the mounting board and the plurality of engagement portions being engaged with the mounting board.

In general, in one aspect, the present invention relates to an optical module mounted body. The optical module mounted body comprising: means for mounting the optical module; and means for engaging a securing member with the mounting board, the optical module being secured therewith on the mounting board.

In general, in one aspect, the present invention relates to a mounting board. The mounting board comprises: a plate member having a mounting surface and an undersurface opposite the mounting surface; and at least one heat conducting member embedded in the plate member and connecting continuously the mounting surface and the undersurface of the plate member, wherein each of the at least one heat conducting member are exposed on each one of the mounting surface and the undersurface.

Other aspects and advantages of the invention will be apparent from the following description and the appended claims.

BRIEF DESCRIPTION OF THE DRAWINGS

FIG. 1-2 is a sectional view showing an optical module mounted body according to the first embodiment of the present invention.

FIG. 1-3 is a perspective view showing a securing member used in the first embodiment of the present invention.

FIG. 1-4 is a sectional view showing an optical module mounted body according to the first embodiment of the present invention, with the engagement portion bent contrarily to the case of FIG. 1-2.

FIG. 1-5 is a perspective view showing a securing member used in the example of FIG. 1-4.

FIG. 1-6 is a sectional view showing a modified example of the first embodiment of the present invention.

FIG. 1-7 is a perspective view showing the securing member used in the modified example of FIG. 1-6.

FIG. 1-8 is an explanatory diagram showing another example of the securing method according to the first embodiment of the present invention.

FIG. 1-9 is an explanatory diagram showing a second embodiment of the present invention, illustrating a method of securing an optical module to a mounting board by use of a securing member.

FIG. 1-10 is a plan view showing an optical module mounted body according to the second embodiment of the present invention.

FIG. 1-11 is a sectional view showing an optical module mounted body of a modified example according to the second embodiment of the present invention.

FIG. 1-12 is a perspective view showing the securing member used in the modified example of FIG. 1-11.

FIG. 1-13 is an explanatory diagram showing an example of the securing method using the securing member.

FIG. 1-14 is a sectional view showing an optical module mounted body according to a third embodiment of the present invention.

FIG. 1-15 is a plan view showing a mounting board used in the third embodiment of the present invention.

FIG. 1-16 is a diagram showing an optical module mounted body according to prior art.

FIG. 2-1 is a plan view showing a first example of the mounting board used in the third embodiment of the present invention.

FIG. 2-2 is a sectional view taken along the line I—I in FIG. 2-1.

FIG. 2-3 is an explanatory diagram illustrating a manufacturing process of the mounting board of the first example.

FIG. 2-4 is a diagram showing another example of heat conducting portion of the mounting board.

FIG. 2-5 is a diagram showing still another example of heat conducting portion of the mounting board.

FIG. 2-6 is a diagram showing still another example of heat conducting portion of the mounting board.

FIG. 2-7 is a diagram showing still another example of heat conducting portion of the mounting board.

FIG. 2-8 is a sectional view showing a second example of the mounting board, or multiplayer wiring board, used in the third embodiment of the present invention.

FIG. 2-9 is a diagram showing an example of the optical module mounted body using the mounting board.

FIG. 2-10 is a diagram showing another example of the optical module mounted body using the mounting board.

DETAILED DESCRIPTION (First Embodiment)

Figure 1:
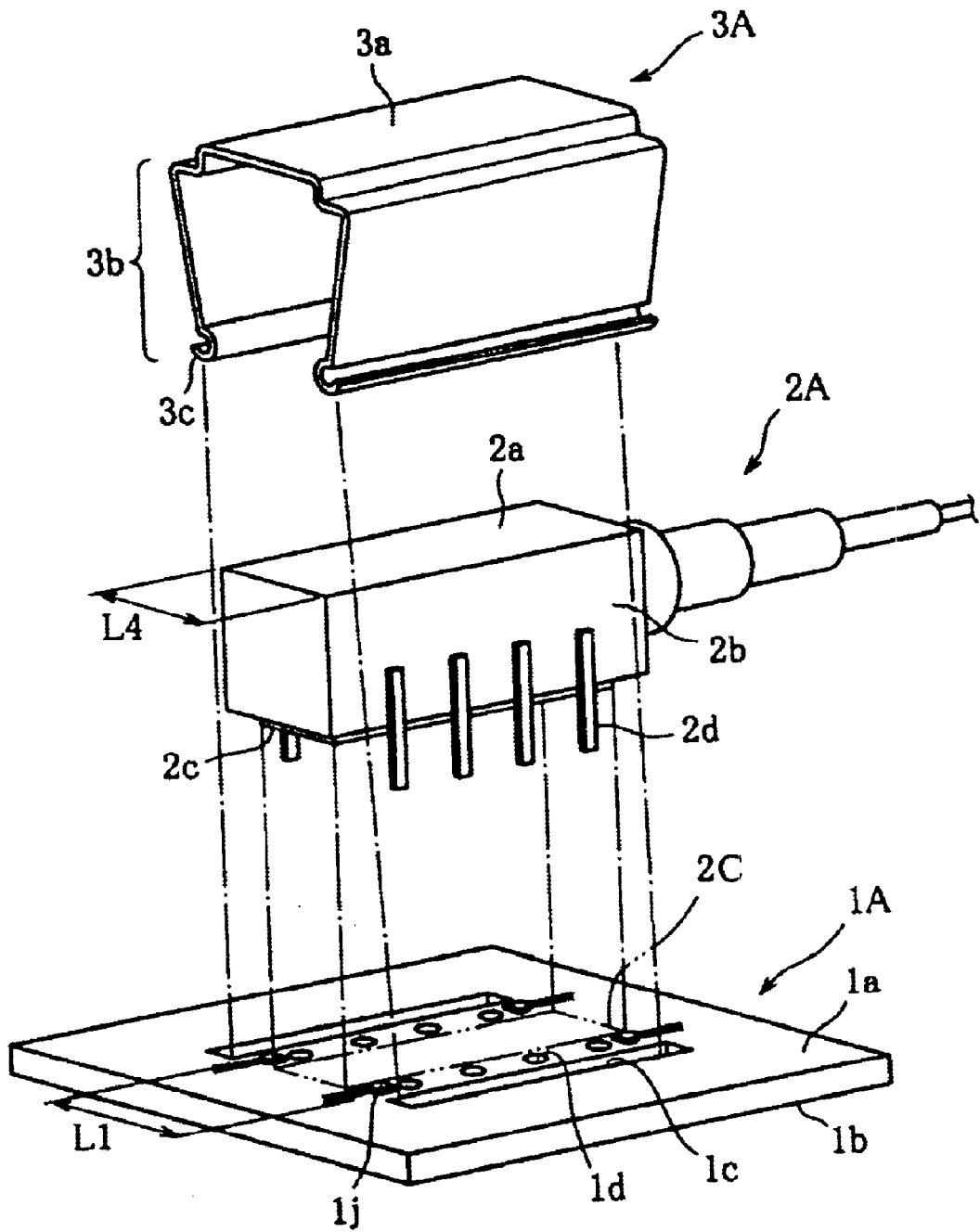
FIG. 1-1 is an explanatory diagram showing a first embodiment of the present invention, illustrating a method of securing an optical module to a mounting board by use of a securing member.
Figures 1, 2:
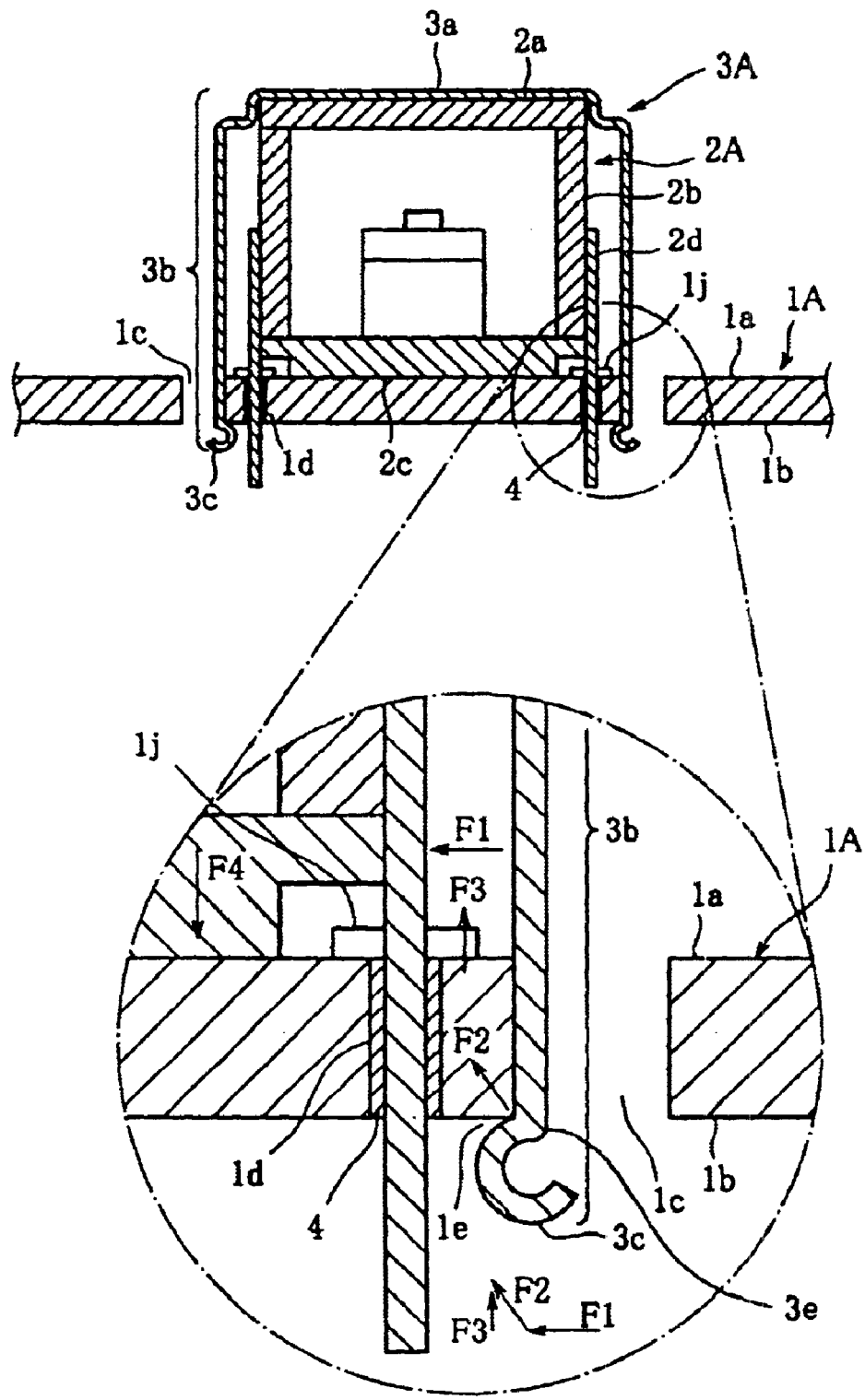

An optical module mounted body according to first embodiment of the present invention is shown in FIG. 1-1 and FIG. 1-2. FIG. 1-1 is an explanatory diagram illustrating a securing method of an optical module to a mounting board by use of a securing member which will be described later. FIG. 1-2 is a sectional view showing an optical module mounted body according to the first embodiment of the present invention.

In the first embodiment of the present invention, a mounting board 1A is formed with through holes 1c each having a long rectangular aperture exposed on each side of the portion where an optical module 2A is mounted (or the portion 2C, enclosed by two-dot chain lines in FIG. 1-1, hereinafter referred to as mounting portion) on a mounting surface. In addition, a plurality of (4 on one side, in the figure) wiring through holes 1d, for receiving lead pins 2d of the optical module 2A, are formed on the portion between the mounting portion 2C and the through holes 1c.

An optical module 2A of so-called a DIP (dual inline package) type, having a plurality of lead pins 2d extending downwards from two opposing sides 2b thereof, is mounted on the mounting portion 2C of the mounting board 1A. The plurality of lead pins 2d are inserted into the wiring through holes 1d and fixed therein by a low-melting point metal 4 and electrically connected to wiring terminals 1j on the mounting board 1A.

Thereafter, a securing member 3A is placed over the optical module 2A, with two legs 3b thereof located alongside of the two opposing sides 2b of the optical modules 2A, and engagement portions 3c, or backs of hook-shaped ends of the legs 3b, being inserted into the through holes 1c of the mounting board 1A. The engagement portions 3c are lead out on an undersurface 1b of the mounting board 1A, where the engagement portions 3c engage with the lower edges of the through holes 1c.

Thus, the optical module 2A is secured on the mounting board 1A, as shown in FIG. 1-2, being held between the securing member 3A and the mounting board 1A.

In the sectional view of FIG. 1-2, since the bottom face 2c of the optical module 2A is in close contact with an upper face 1a of the mounting board 1A by means of the securing member 3A, the heat transfer from the optical module 1A through the bottom face 2c to the mounting board 1A is enhanced. The top face 2a of the optical module 2A is in close contact with nearly entire lower face of the upper portion 3a of the securing member 3A. The both legs 3b of the securing member 3A extend alongside the two opposing sides 2b of the optical module 2A, and the engagement portions 3c formed at the ends of the legs 3b are inserted through the respective through holes 1c to engage with the corner 1e on the lower surface 1b of the mounting board 1A.

For the purpose of enhancing heat dissipation, the optical module 2A needs to be pressed against the mounting board 1A so as to be in close contact with the mounting board 1A. In the present invention, the legs 3b of the securing member 3A is resilient, exerting a restoring force F1 (see FIG. 1-2) orienting inward (i.e. toward the optical module) when the engagement portions 3c engage with the corners 1e on the lower face 1b in the respective through holes 1c.

By properly setting the length of the legs 3b, the corner 1e of the through hole 1c on the lower face 1b of the mounting board 1A and a neck portion 3e of the engagement portion 3c (or, a connection point of the roundly formed end portion and the rectilinear portion of the legs 3b in FIG. 1-2) are able to come into contact with each other, each exerting a force F1 against other, and consequently generating a diagonally upward force F2 at the corner 1e. Therefore, upward component F3 of the force F2 works on the mounting board 1A (see FIG. 1-2). It is needless to say that the reactive force having the same magnitude works on the legs 3b.

The force F3 thus exerted by the engagement portion 3c on the corner 1e of the mounting board 1A acts to lift the bottom face 2c of the optical module 2A while the opposing force having the equivalent magnitude F3 exerted by the upper portion 3a of the securing member 3A on the top face 2a of the optical module 2A acts to hold back the optical module 2A. Consequently, the optical module 2A is fixed on the mounting board 1A with the pressing force F3. (Note that since the securing member 3A of the present embodiment has two legs 3b, the optical module 2A is fixed to the mounting board 1A with a pressing force F4, which is twice as large as the force F3.)

The mounting board 1A and the securing member 3A used in the above embodiment will be explained in detail below.

As shown in FIG. 1-1, the mounting board 1A is formed with two through holes 1c, 1c, spaced by a distance L1. Each through hole 1c has a long rectangular aperture, with its two opposing longer sides being longer than the longitudinal length of the leg 3b of the securing member 3A and its two opposing shorter sides being slightly wider than the width of the engagement portion 3c as viewed in its cross section, for allowing the insertion of the engagement portions 3c.

In addition, the mounting board 1A is formed with a plurality of wiring through holes 1d, a plurality of wiring terminals 1j, and a predetermined wiring patterns for electrical connection to outside.

Figures 1, 2, 3:
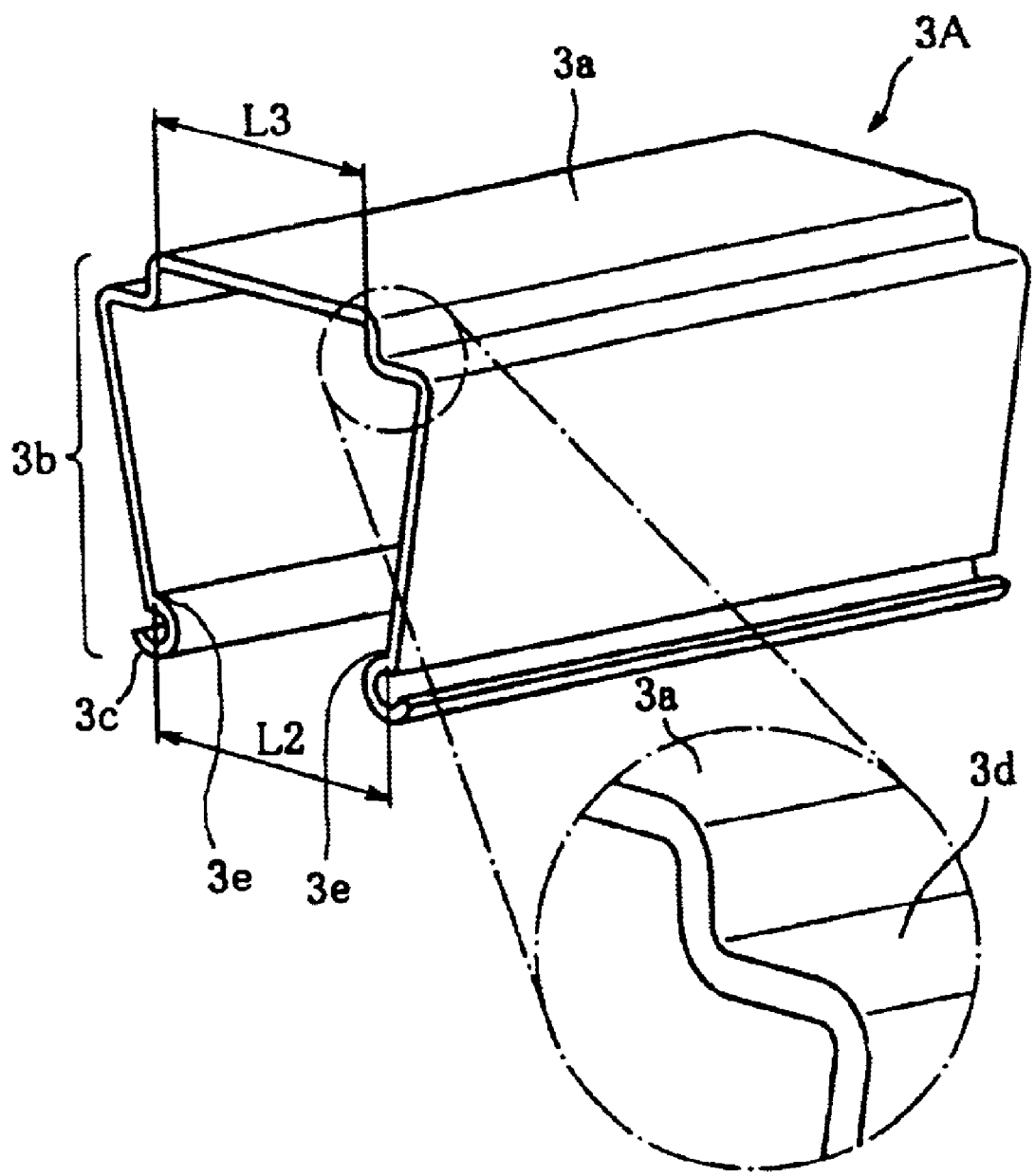

FIG. 1-3 is a perspective view showing an example of the securing member 3A.

The securing member 3A is made from a resilient plate member formed of a material such as stainless steel, resin or engineering plastics. The thickness of the plate member made of the material is selected so as to enable the resultant legs 3b to exert a proper magnitude of pressing force arising from the restoring force when deformed in being attached to secure an optical module. In the example shown in FIGS. 1-1 to 1-3, the upper portion of the securing member 3A is made flat. The upper portion 3a and the leg portion 3b are integrally formed, with a stepwise intermediate portion 3d interposed between them. The leg 3b extends vertically downward from a lateral end of the intermediate portion 3d. A lateral width L3 of the upper portion 3a of the securing member 3A is made slightly larger than a lateral width L4 of the top face 2a of the optical module 2A (see FIG. 1-1), allowing the top face 2a of the optical module 2A and the lower face of the upper portion 3a of the securing member 3A to be in contact with each other in an accurate and stable manner.

The distance between the two intermediate portions 3d are made nearly equal to or slightly larger than the distance L1 between the two through holes 1c of the mounting board 1A. The separation between the two opposing legs 3b, 3b are made smaller as it approaches to the engagement portions 3c formed on their respective ends, wherein the separation L2 of the two legs 3b just above the engagement portions 3c is smaller than the distance L1 between the through holes 1c of the mounting board 1A to ensure that a proper magnitude of restoring force is exerted by the legs 3b.

The engagement portion 3c formed at each end of the legs 3b is formed by roundly bending a tip end of the rectilinear leg 3b, and projecting inward of the securing member 3A. Each of the engagement portions 3c has a neck portion 3e where the roundly formed end portion and the rectilinear portion of the leg 3b meet, wherein the neck portion 3e is formed so as to engage with the corner 1e of the through hole 1c on the lower face 1b of the mounting board 1A when attaching the securing member 3A to the mounting section is smaller than a length of the shorter side of the rectangular through hole 1c, so that the engagement portion 3c is accessible to the lower face 1b of the mounting board 1A via the through hole 1c.

In the present embodiment of the invention, the optical module 2A can be fixedly pressed to the mounting board 1A by using the compact securing member 3A which is formed to fit the outer shape of the optical module 2A and to have resilient legs 3b, facilitating attachment and detachment of the optical module 2A to the mounting board 1A. Therefore, in the present invention, it is possible to mount optical modules in a reduced time. In addition, the present invention eliminates the need of flanges to fasten the optical module by screwing, occupying a reduced space when the optical module is mounted on the mounting board 1A.

Note that in case of replacing the optical module 2A, it can be detached easily from the mounting board 1A simply by expanding apart the engagement portions 3c, withstanding the pressing force F1, and drawing the securing member 3A upward.

In the above embodiment, the engagement portions 3c engage with the inner corners 1e of the through hole 3c, as shown in FIG. 1-2. However, the securing member 3A may be formed such that the engagement portions 3c engage with outer corners 1e' of the through hole 1c on the lower face 1b of the mounting board 1A, as shown in FIG. 1-4. In this case, the distance L2 (see FIG. 1-5) between the two legs 3b just above the engagement portions 3c is made larger than the distance between the through holes 1c. The engagement portion 3c may be formed as a hook-shaped end of the leg 3b, the round bending of the hook-shape projecting outward to serve as the engagement portion. The optical module 2A in this case can be fixed to the mounting board 1A easily, by pressing the two legs 3b of the securing member 3A inward, inserting the engagement portions 3c into the through holes 1c and releasing the two legs 3b to cause the engagement portions 3c to engage with the outer corners 1e' of the through holes 1c on the lower face this case can be detached from the mounting board 1A simply by pressing inward the two legs 3b of the securing member 3A to disengage the engagement portions 3c with the outer corner 1e' of the through hole 1c, and drawing the securing member 3A upward.

In the securing method of the present invention, the optical module 2A is fixed with a force worked by a securing member 3A along a longitudinal range where the engagement portion 3c and the corner 1e(1e') of the mounting board 1A are in contact. Therefore, as opposed to the case of an optical module being fixed with screws, the optical module 2A is free from concentration of strain on any particular portion of the optical module. Hence, the optical module is immune from optical misalignment of the LD and the optical fiber, and consequent decrease in optical output as well. In addition, in the present invention, efficient heat transfer from the bottom plate 2c of the optical module to the mounting board 1A can be ensured by the pressing force uniformly worked on the optical module.

FIG. 1-6 is a sectional view showing a modified example of the first embodiment of the present invention.

The modified example is similar to the above embodiment except for a securing member 3B having a different shape of upper portion. As shown in FIG. 1-7, the securing member 3B of this modified example has the upper portion 3a1 which is convex downward such that a center portion of the upper portion 3a1 abuts against the top surface 2a of the optical module 2A. Like in the example shown in FIG. 1-2, the resilient nature of the legs 3b can give rise to the force F5, as depicted by the upward arrow in FIG. 1-6. The upward force F5 in turn causes the upper portion 3a1 of the securing member 3B to deform elastically, giving rise to the force of the same magnitude F5, that press the optical module 2A against the mounting board 1A, as depicted by the downward arrow in FIG. 1-6.

In the above securing methods, the securing member 3A or 3B was attached over the optical module 2A after the lead pins 2d were adhered within the wiring through holes 1d and to the wiring terminals 1j. However, the securing member 3A or 3B may be attached before the lead pins 2b are adhered.

FIG. 1-8 is an explanatory diagram showing another example of the securing method according to the first embodiment of present invention, in which a plurality of the lead pins 2d are received within a DIP socket 5.

In the example, an optical module 2A is placed on a mounting portion of the mounting board 1A, with its plurality of lead pins 2d being inserted into the corresponding wiring through holes 1d (see FIG. 1-8A). Then, a securing member 3B with a convex top surface 3a1 is placed over the optical module 1A to fix it to the mounting board 1A (see FIG. 1-8B). Thereafter, ends of the plurality of lead pins 2d are mated with corresponding female contacts of the DIP socket 5 arranged on the lower face 1b of the mounting board 1A, whereby electric connection to outside is established (see FIG. 1-8C).

In the above method, the use of the DIP socket for electrical connection eliminates the need of soldering process of the lead pins $2d$, thereby further simplifying the attachment or detachment of the optical module 2A. Furthermore, since the optical module 2A is not soldered in this method, it is easy to replace the optical module with a new one by simply detaching the securing member.

(Second Embodiment)

In the above-described optical module mounted body, the optical module was of DIP type, having a plurality of lead pins extending downwards from two opposing sides of the optical module 2A. However, as will be explained below, the present invention may be applicable to an optical module 2B of so-called a butterfly-type, wherein a plurality of lead pins are protruding from two opposing sides of the optical module and are to be arranged parallel to the mounting board.

FIG. 1-9 is an explanatory diagram showing a second embodiment of the present invention, illustrating a method of securing an optical module 2B to a mounting board 1B by use of a securing member 3C. FIG. 1-10 is a plan view showing an optical module mounted body according to the second embodiment of the present invention.

The mounting board 1B is formed with a long rectangular through hole $1f1$ adjacent to one longitudinal side of a mounting portion 2D on which the optical module 2B is to be mounted, and two rectangular through holes $1f2$, $1f3$ adjacent to the other longitudinal side from which an optical fiber is to be arranged. As shown in FIG. 1-9, the latter two rectangular through holes $1f2$, $1f3$ are shorter in length of longer side than the through hole $1f1$. In addition, a plurality of wiring terminals $1j$, for electrical connection of the plurality of lead pins $2e$ to outside, are formed on both lateral sides of the mounting portion 2D, to which the plurality of lead pins $2e$ are to protrude from the optical module 2B.

The optical module 2B is disposed on the mounting portion 2D of the mounting board 1B, with its plurality of protruding lead pins $2e$ resting on the respective wiring terminals $1j$. Then, the lead pins $2e$ are soldered to the wiring terminals $1j$ by use of a low melting point metal 4, whereby electrical connection is established.

Thereafter, a securing member 3C is placed over the optical module 2B, with its three legs $3f1$, $3f2$, $3f3$ lying alongside of the two opposing longitudinal sides of the optical module 2B. Engagement portions $3c$ formed on respective ends of the three legs are inserted through respective through holes $1f1$, $1f2$, $1f3$, so that they engage with the mounting board 1B on the lower face thereof.

Thus, the optical module 2B is secured on the mounting board 1B, as shown in FIG. 1-10.

In the second embodiment of the present invention, the legs $3f1$ to $3f3$ are formed on both longitudinal ends of the securing member 3C, allowing the optical module 2B having the laterally protruding lead pins $2e$ from its two opposing lateral sides to be fixed on the mounting board 1B.

In the second embodiment, the pressing force of the optical module 2B against the mounting board 1B is generated in the similar manner to the case of the first embodiment.

Note that the magnitude of the pressing force is nearly proportional to the lateral width of the legs, so preferably, the three legs may be formed such that the restoring force arising from the solitary leg $3f1$ and the combined restoring force of the legs $3f2$ and $3f3$ are substantially equivalent.

The details of the mounting board 1B and the securing member 3C, which are used in the above securing method in the second embodiment, will be described below.

In FIG. 1-9 the three through holes $1f1$ to $1f3$ are formed so as to allow three engagement portions $3c$ of the three legs $3f1$ to $3f3$ to be inserted, i.e., the longer side of the through hole $1f1$ being longer than the lateral width of the leg $3f1$, those of the through holes $1f2$ and $1f3$ being longer than that of the legs $3f2$ and $3f3$, and the shorter side of all the through holes being wider than the width in cross section of the engagement portion $3c$.

The distance L1 between the through holes are selected to be nearly equal to or smaller than the distance between the legs at the position near the upper portion $3a2$ of the securing member 3B, so that the legs $3f1$ to $3f3$ exert a proper magnitude of restoring forces.

The upper portion $3a2$ of the securing member 3C is convex toward the top surface $2a1$ of the optical module 2A. The three legs $3f1$ to $3f3$ extends vertically downward from longitudinal ends of the upper portion $3a2$ of the securing member 3C, correspondingly to the three through holes $1f1$ to $1f3$ of the mounting board 1B.

In addition, the securing member 3C is formed with a cutout $3g$ between the two legs $3f2$ and $3f3$ on the front end (right-side end in FIG. 1-9) from which the optical fiber extends. The cutout $3g$ is adapted to receive an optical fiber feed-through pipe $2f$. Engagement portions $3c$ are formed on respective ends of the legs $3f1$ to $3f3$.

For the purpose of obtaining a restoring force from the legs, the distance between the leg $3f1$ and the legs $3f2/3f3$ is smaller as it approaches to the engagement portions $3c$, and the distance L2 just above the engagement portion $3c$ is smaller than the distance L1 between the through holes of the mounting board 1B.

In the second embodiment of the present invention, the securing member 3C, having the legs $3f1$ to $3f3$ extending downward from the longitudinal ends of the upper portion $3a2$, was used to fix the optical module 2B of so-called a butterfly-type to the mounting board 1B. For the purpose of fixing the butterfly-type optical module, however, the securing member 3C may be replaced by one obtained by forming on each leg $3b1$ of the securing member 3B, which is shown in FIG. 1-7 of the first embodiment, a cutout for avoiding interference with the laterally-protruding lead pins. Such a modified example of the optical module mounted body according to the second embodiment of the present invention is shown in FIG. 1-11 in its sectional view. FIG. 1-12 is a perspective view showing the securing member 3D used in the modified example.

As shown in FIG. 1-12, the securing member 3D used in the modified example has a cutout $3b3$ in each of the legs formed on both lateral ends of the upper portion $3a1$, for avoiding interference with the lead pins laterally protruding from the two opposing lateral sides of the optical module. As shown in FIGS. 1-11 and 1-12, the securing member 3D is placed over the optical module 2B such that a plurality of the laterally protruding lead pins $2e$ are received within the cutout $3b3$ of the securing member 3D, with the through hole $1c$ and engaging with the lower face $1b$ of the mounting board 1C. The mounting board 1C in this example is formed with a plurality of wiring terminals $1j$, instead of the plurality of the wiring through holes $1d$ of the first embodiment. Each of the lead pins $2e$ are soldered to each of the wiring terminals $1j$.

The number of the through holes $1c$ of the mounting board 1C may be four correspondingly to the number of the legs $3b2$ of the securing member 3D, such that each through hole $1c$ receives each of the engagement portion $3c$ of the leg $3b2$.

Note that the securing members explained in the first and second embodiments may be used to temporarily fix an optical module to the mounting board.

Referring now to FIG. 1-13, an optical module 2A is disposed on a mounting portion 2C on a mounting board 1A, and a plurality of lead pins 2d extending downwards are inserted in the wiring through holes 1d of the mounting board 1A (see FIG. 1-13A).

Then, a securing member 3B is placed over the optical module 2A and attached to the mounting board 1A, whereby the optical module 2A is fixed (see FIG. 1-13B).

Thereafter, each lead pins 2d of the optical module 2A are soldered within each wiring through holes 1d and to each wiring terminals 1j of the mounting board 1A by a low-melting point metal 4 (see FIG. 1-13C).

Finally, the securing member 3B is detached from the mounting board 1A (see FIG. 1-13D).

With the above securing method, the lead pins 2d of the optical module 2A are adhered to the mounting board in the state that the optical module is firmly fixed to the mounting board 1A, whereby the work of fixation of optical modules can be done in a stable manner and it is possible to maintain the state of close contact of the optical module to the mounting board after the securing member 3B is removed.

In the first and second embodiment, heat-conducting material such as heat-conducting grease, a plating layer, or a sheet of indium can be preferably interposed between a bottom face 2c of the optical module and an upper face 1a of the mounting board for the purpose of enhancing the heat transfer.

(Third Embodiment)

FIG. 1-14 is a sectional view showing an optical module mounted body according to a third embodiment of the present invention.

The optical module mounted body according to the third embodiment differs from the first or second embodiment in that the mounting board comprises a plurality of heat conducting member in a mounting portion.

FIG. 1-15 is a plan view showing a mounting board 1D used in the third embodiment. The plurality of heat conducting member 7 are provided in the mounting portion of an optical module 2A, which is depicted with two-dot chain lines 2C. The other constituents including the through holes 1c, and the wiring through holes 1d are similarly formed to the mounting board 1A. The heat-conducting members 7 are embedded in the mounting portion 2C. Both ends 7a, 7b of the heat-conducting members are exposed on both side 1a (upper surface, or mounting surface), 1b (lower surface) of the mounting board 1D, wherein at least one ends 7a of the heat-conducting member 7 are in contact with the bottom face 2c of the optical module 2A.

The heat transferred from the optical module 2A is efficiently conducted through the heat-conducting members 7 to the lower face 1b of the mounting board 1D, wherefrom the heat is dissipated into the air.

Thus, in the third embodiment of the present invention, it is possible not only to fix optical modules easily; compactly and surely to a mounting board by use of the securing member, but also to enhance heat dissipation by the heat-conducting members embedded in the mounting board and continuously connecting the mounting surface and the lower surface opposite the mounting surface.

Detailed explanations of some examples of such mounting boards (or, heat-conducting mounting board), which are applicable in the third embodiment, will be given below.

(First Example of Heat-Conducting Mounting Board)

FIGS. 2-1 and 2-2 show a first example of the mounting board that is applicable to the third embodiment of the present invention. FIG. 2-1 is a plan view showing the first example of a wiring board which is used as the mounting board in the present invention, and FIG. 2-2 is a sectional view taken along the line I—I in FIG. 2-1.

The wiring board 11A has heat-conducting portions 14, as enclosed by dashed lines in FIG. 2-2. The heat-conducting portions 14 pierce the wiring board 11A, connecting one surface (an upper face in FIG. 2-2) 11a and the other surface (a lower face in the figure) 11b, on the portion as enclosed with two-dot chain lines in FIG. 2-1, on which an optical module A is to be placed.

A predetermined wiring patterns 12a and wiring terminals 12b are formed adjacent the mounting portion of the optical module A on the upper face 11a of the wiring board 11A.

The heat-conducting portions 14 comprise a plurality of through holes 11c piercing the wiring board 11A from its upper face 11a to lower face 11b, and a plurality of heat-conducting members 14A each held within each of the through holes 11c. Both ends 14a, 14b of the heat-conducting member 14A are appearing on the upper surface 11a and lower surface 11b.

Placing the optical module A onto the mounting portion, the upper end 14a of the heat-conducting member 14A and a bottom face of the optical module A come in contact with each other. In this configuration, the heat transferred from the optical module A is conducted from the upper end 14a to the lower end 11b of the heat conducting member 14A, and thereafter dissipated into the air.

For the purpose of enhancing heat conducting performance, the mounting board 11A may be formed with a first heat-conducting layer in contact with the upper ends 14a of the heat-conducting members 14A exposed on the upper face 11a of the mounting portion on which the optical module A is placed, and a second heat-conducting layer in contact with lower ends 14b of the heat-conducting members 14A exposed on the lower face 11b.

Such heat-conducting layers enable efficient heat transfer from a wider area of the upper surface 11a to the lower surface 11b, and efficient heat dissipation from the lower surface 11b, since the first heat-conducting layer collects heat to the upper ends 14a of the heat-conducting members 14A and the second heat-conducting layer spreads heat transferred to the lower ends 14b over the second heat-conducting layer, wherefrom the heat is dissipated.

In the present example of the heat-conducting mounting board 11A, the plating layers 13 formed both on the upper surface 11a and the lower surface 11b of the wiring board 11A serve as the first and the second heat-conducting layers. In this case, the plating layer 13 may be formed simultaneously with the wiring patterns 12a during a manufacturing process of the wiring board 11A.

Alternatively, a metal layer deposited by PVD (physical vapor deposition) or the like method, or a sheet of metal adhered to the board may be used as the heat-conducting layers.

In the above example, the upper ends 14a of the heat-conducting member 14A may preferably be formed flat so as to come in planar contact performance is enhanced.

A formation process of the heat-conducting portions 14 will be explained below.

First, a plurality of through holes 11c are formed in a portion on a board 11A on which the optical module A is to be placed, as shown in FIG. 2-3A.

Then, as shown in FIG. 2-3B, plating layers 13 are formed on internal surfaces of all the through holes 11c, an upper surface in the mounting portion and a lower surface of the wiring board 11A.

Thereafter, melt of a low-melting point metal is poured inside the through holes 11c and cooled there to form heat-conducting members 14A within the through holes 11c, as shown in FIG. 2-3C. Preferably, the melt are poured until at least upper ends 14a of the resulting heat-conducting members 14A are flush with or slightly project above the upper face (mounting surface) 11a of the wiring board 11A, in order to ensure the contact between the heat-conducting member 14A and the optical module A.

The upper ends 14a of the heat-conducting members 14A may be polished to be flush with the plating layer 13, such that the bottom face of the optical module A are in contact with both the heat-conducting members 14A and the plating layer 13.

Note that the number, positions, size or shape, etc. of the heat-conducting members 14A are determined in relation to the heat dissipating performance required.

FIGS. 2-4 to 2-7 shows other examples of the heat-conducting portions in the wiring board.

Figures 1, 2, 3, 4:
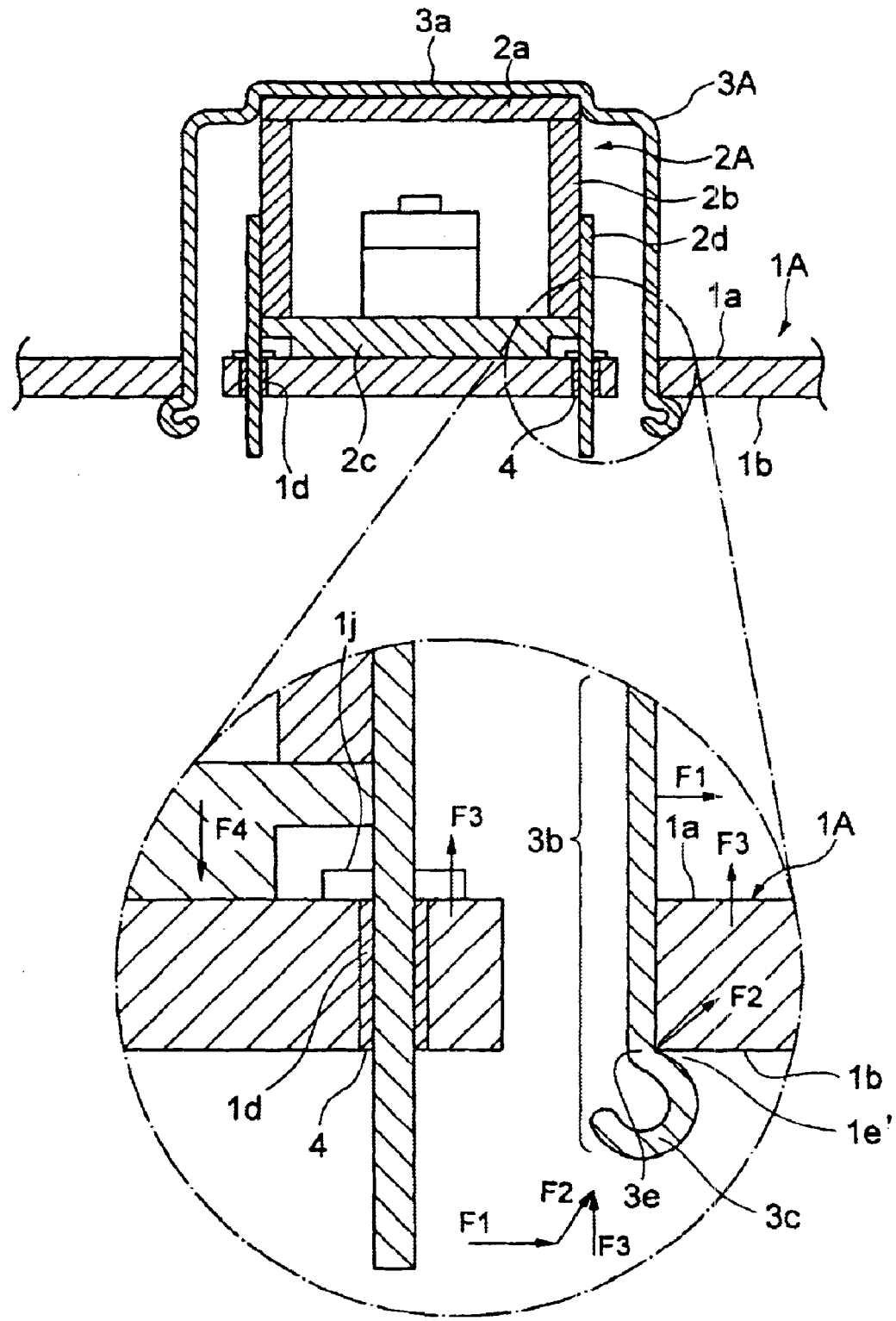
Figures 1, 2, 3, 4, 5:
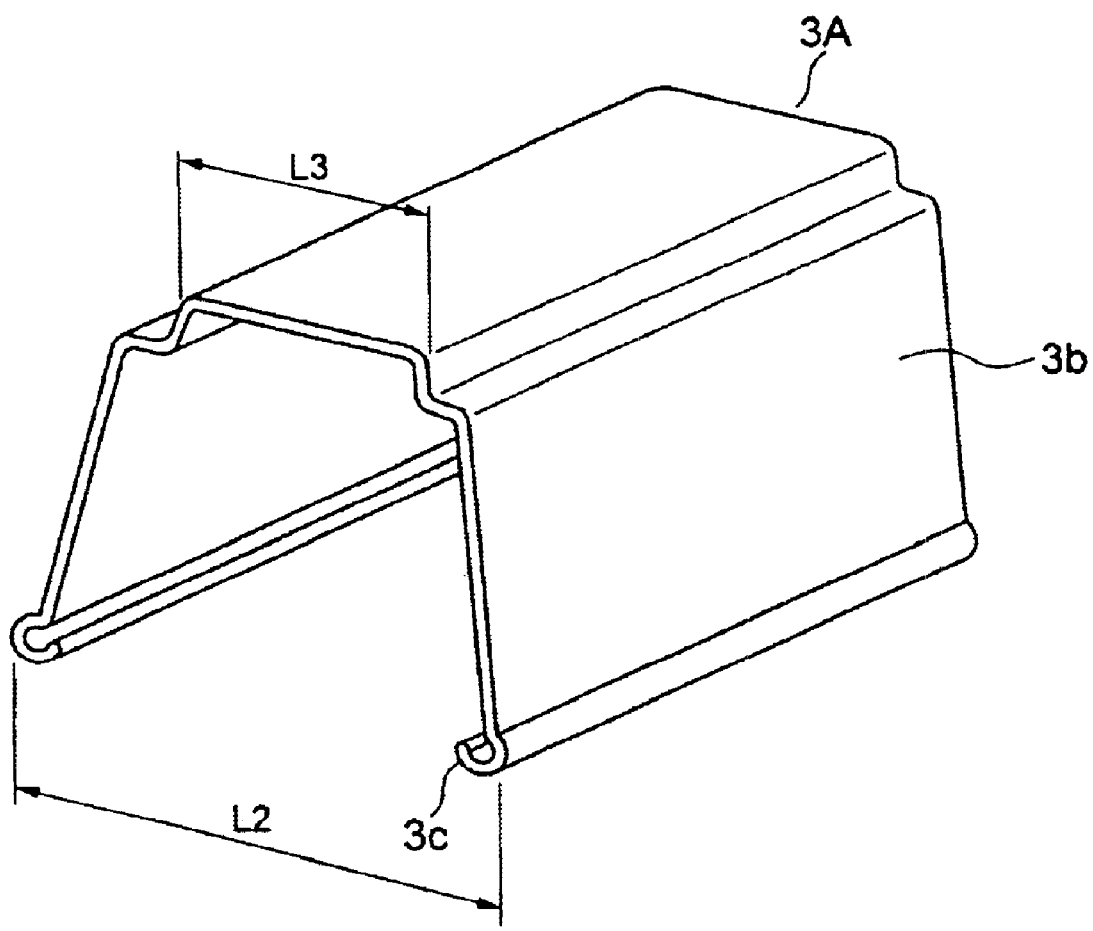
Figures 1, 2, 3, 4, 5, 6:
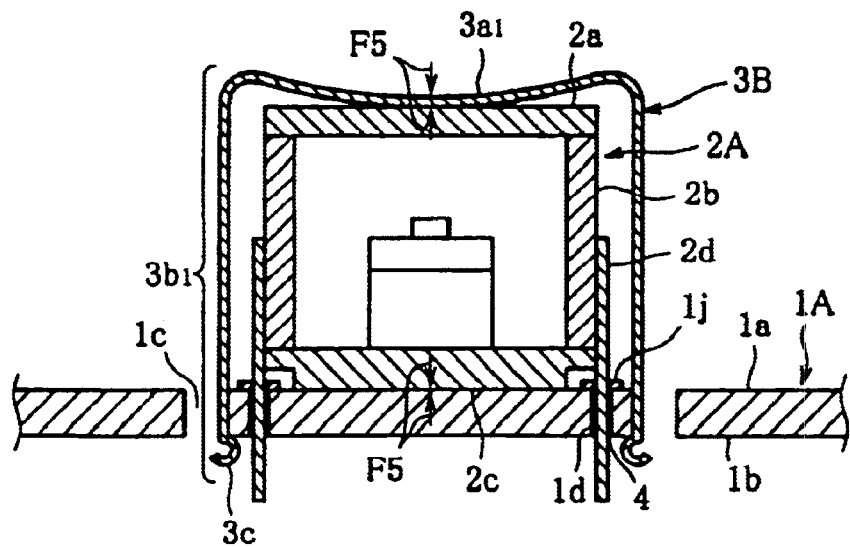
Figures 1, 2, 3, 4, 5, 6, 7:
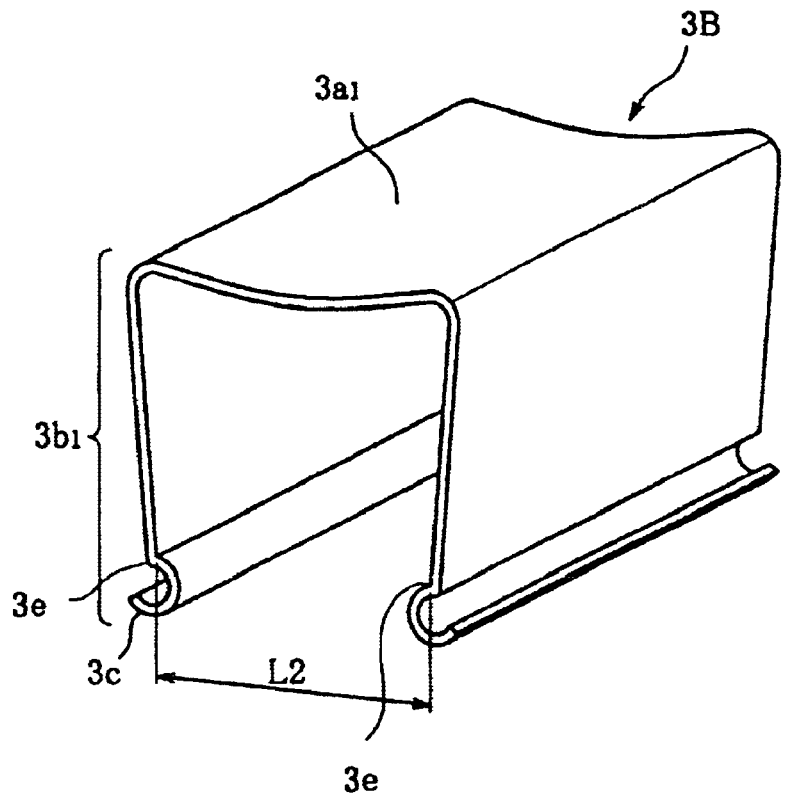
Figures 1, 2, 3, 4, 5, 6, 7, 8, 8A:
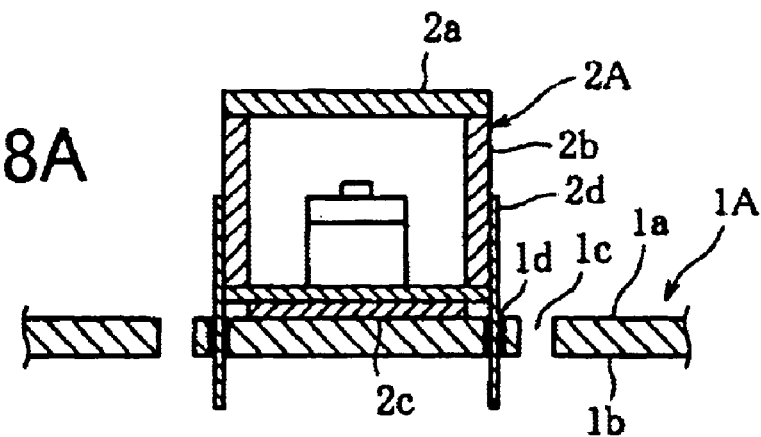
Figures 1, 2, 3, 4, 5, 6, 7, 8, 8B:
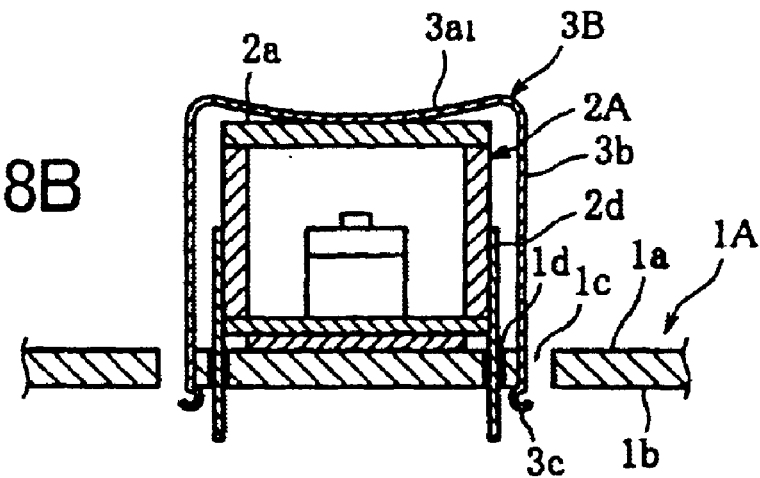
Figures 1, 2, 3, 4, 5, 6, 7, 8, 8C:
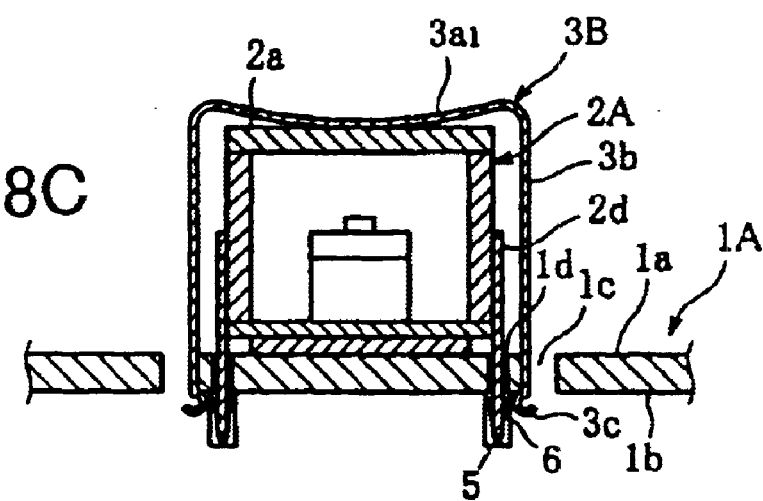
Figures 1, 2, 3, 4, 5, 6, 7, 8, 9:
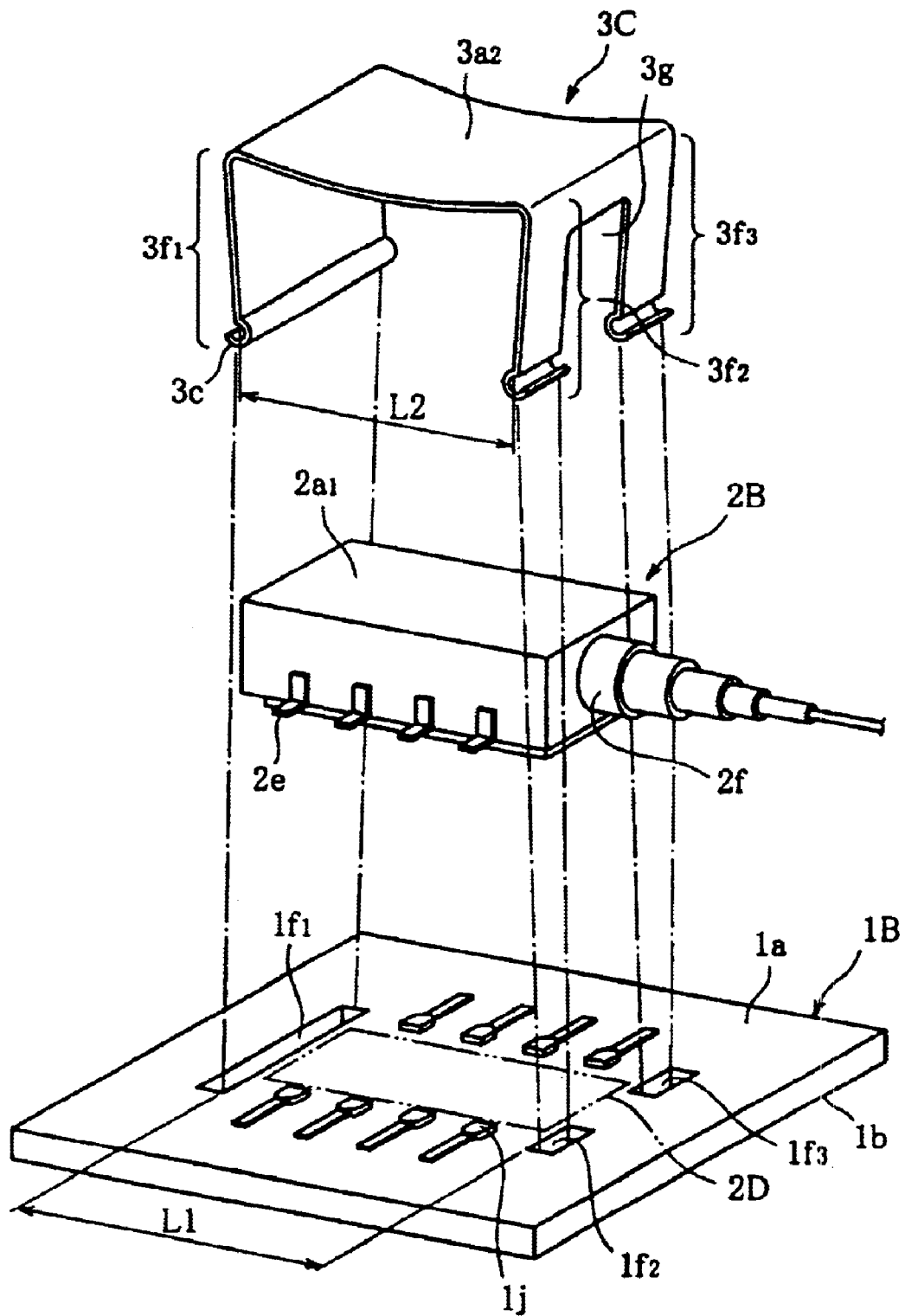
Figures 1, 2, 3, 4, 5, 6, 7, 8, 9, 10:
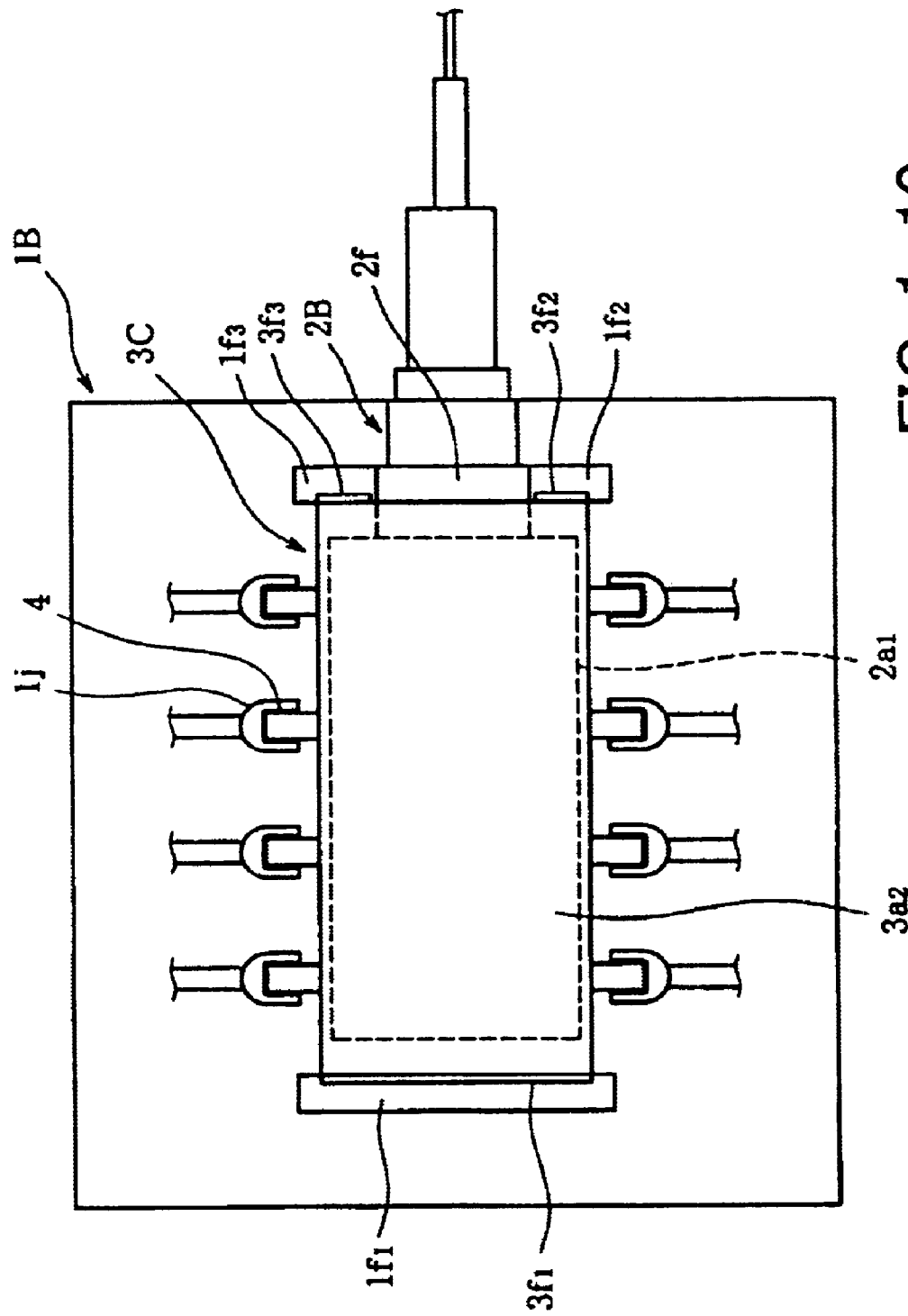
Figures 1, 2, 3, 4, 5, 6, 7, 8, 9, 10, 11:
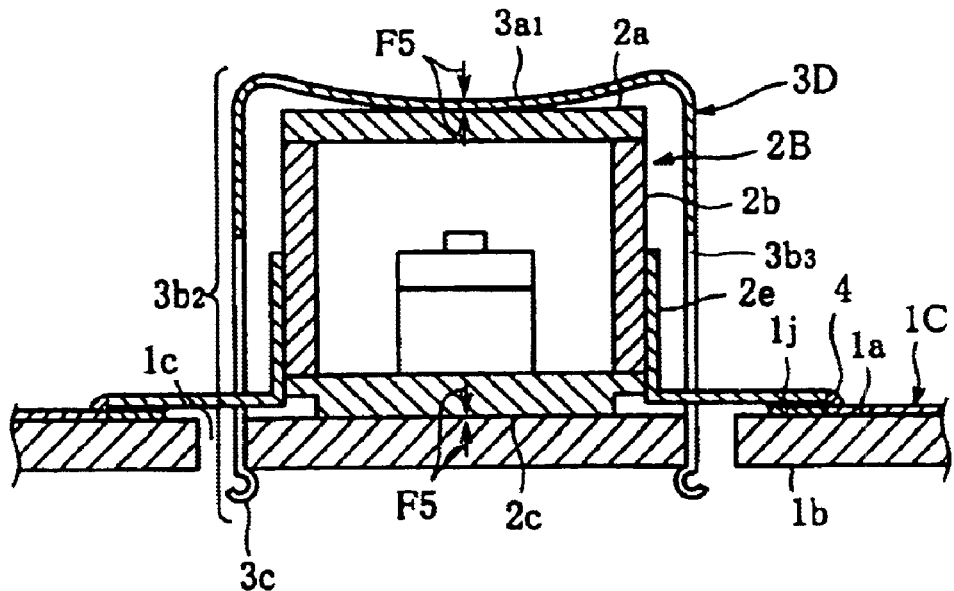
Figures 1, 2, 3, 4, 5, 6, 7, 8, 9, 10, 11, 12:
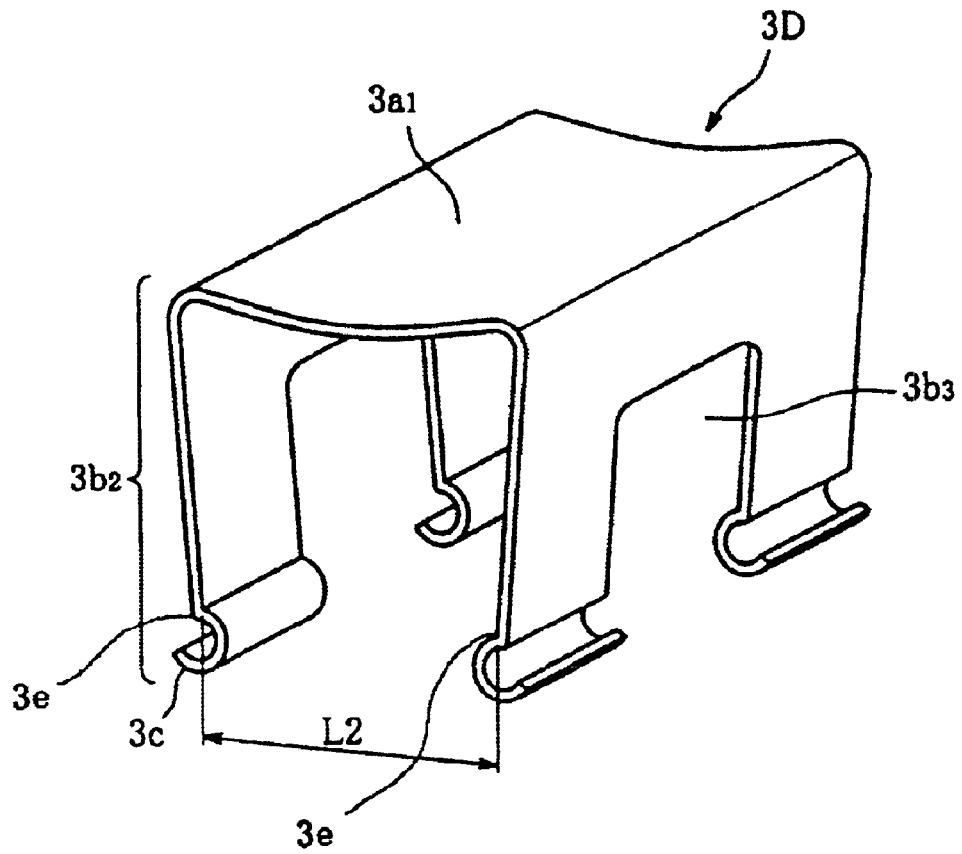
Figures 1, 2, 3, 4, 5, 6, 7, 8, 9, 10, 11, 12, 13, 13A:
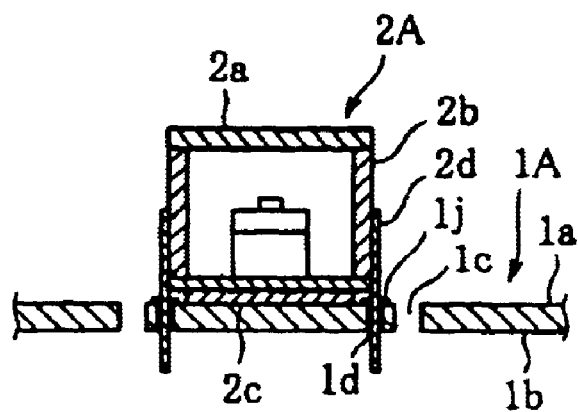
Figures 1, 2, 3, 4, 5, 6, 7, 8, 9, 10, 11, 12, 13, 13B:
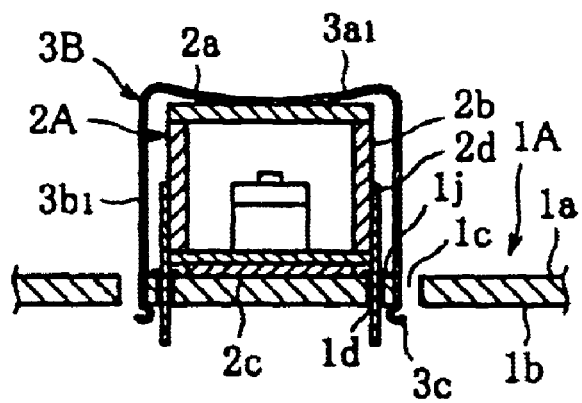
Figures 1, 2, 3, 4, 5, 6, 7, 8, 9, 10, 11, 12, 13, 13C:
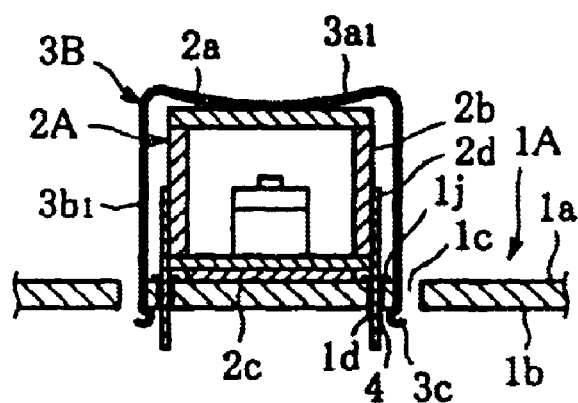
Figures 1, 2, 3, 4, 5, 6, 7, 8, 9, 10, 11, 12, 13, 13D:
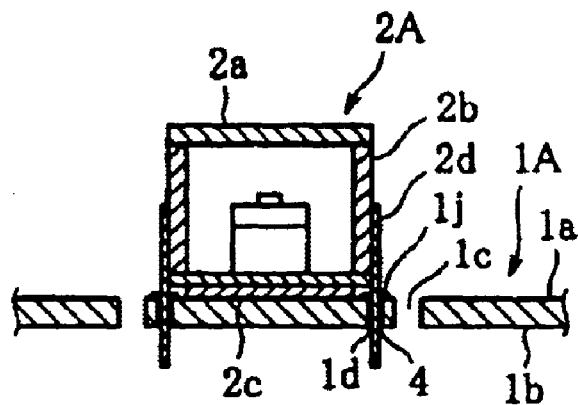
Figures 1, 2, 3, 4, 5, 6, 7, 8, 9, 10, 11, 12, 13, 14:
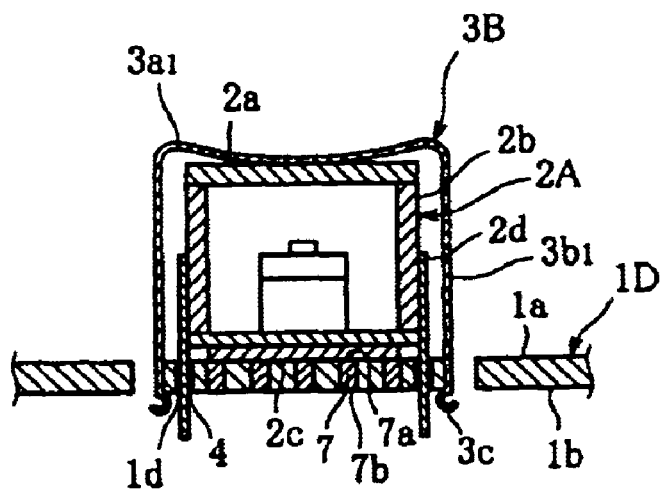
Figures 1, 2, 3, 4, 5, 6, 7, 8, 9, 10, 11, 12, 13, 14, 15:
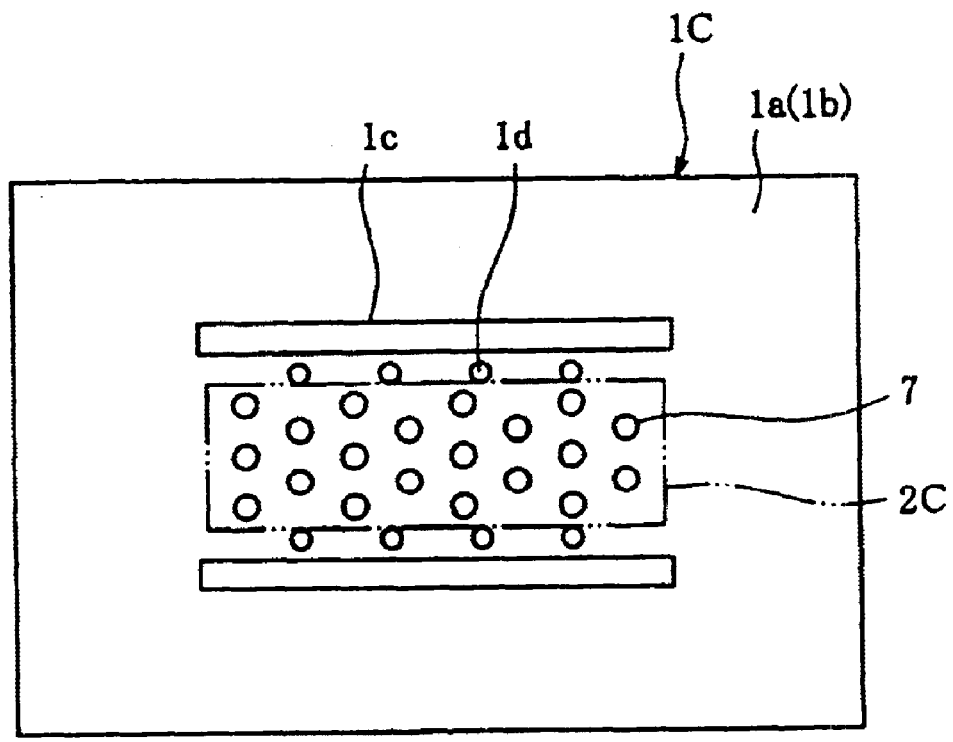
Figures 1, 2, 3, 4, 5, 6, 7, 8, 9, 10, 11, 12, 13, 14, 15, 16:
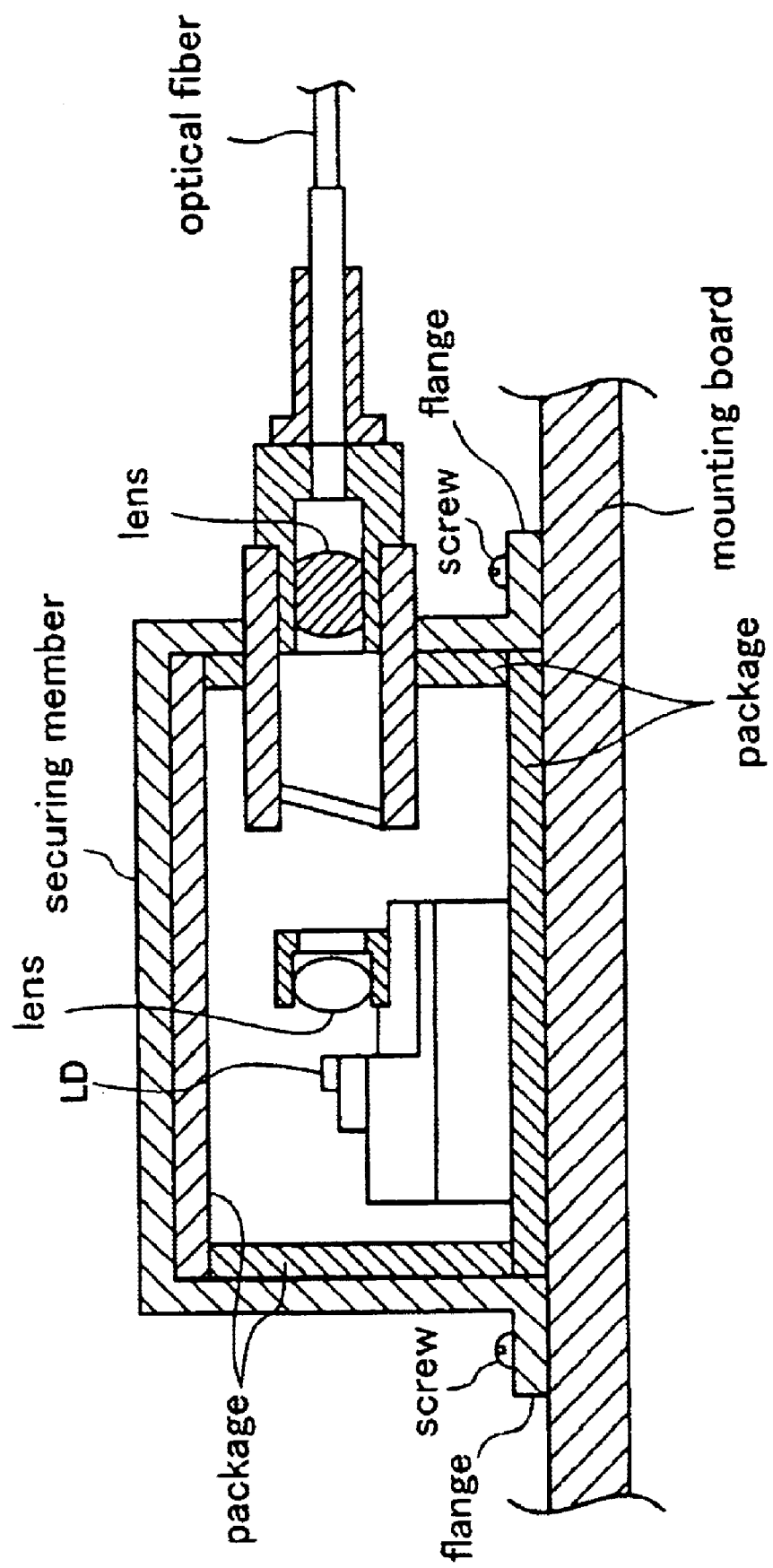
Figures 1, 2:
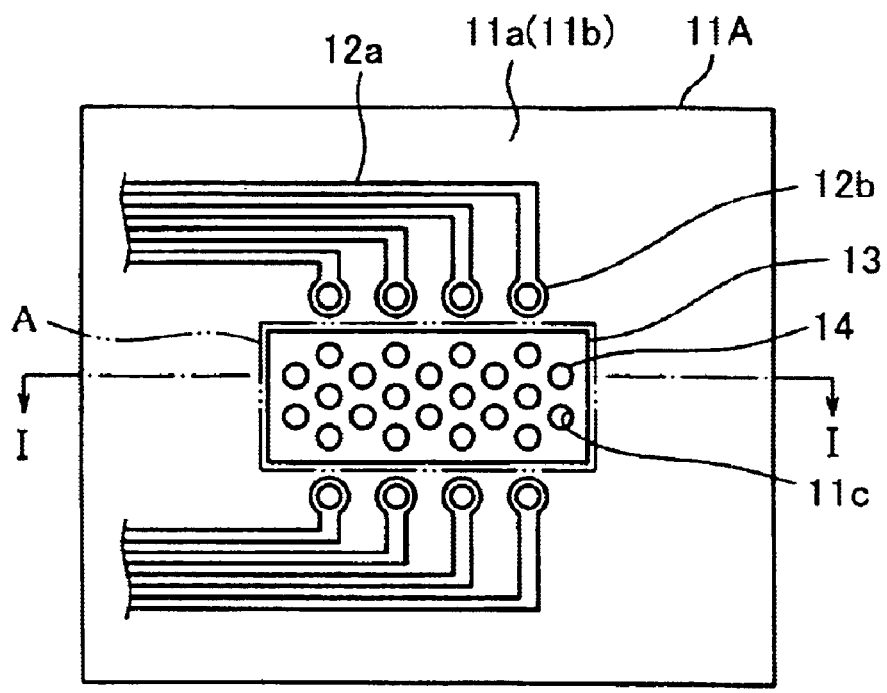
Figure 2:
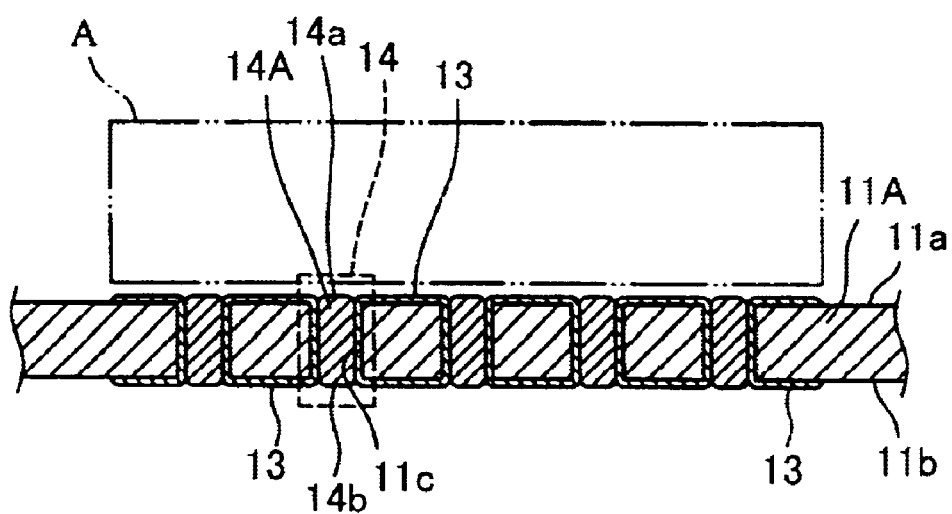
Figures 2, 3, 4, 5:
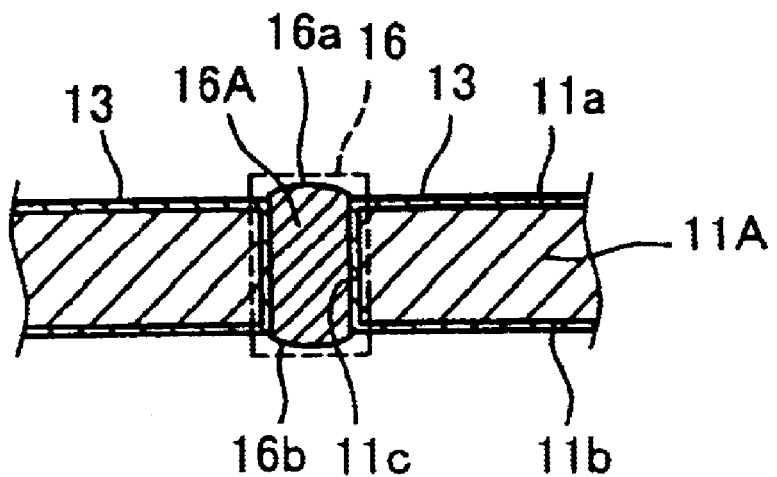
Figures 2, 3, 4, 5, 6:
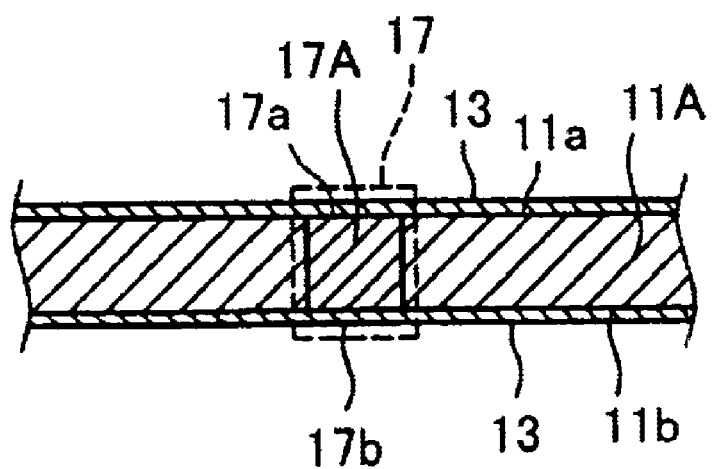
Figures 2, 3, 4, 5, 6, 7, 7A:
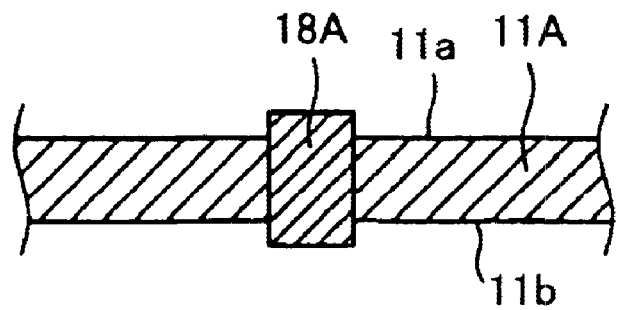
Figures 2, 3, 4, 5, 6, 7, 7B:
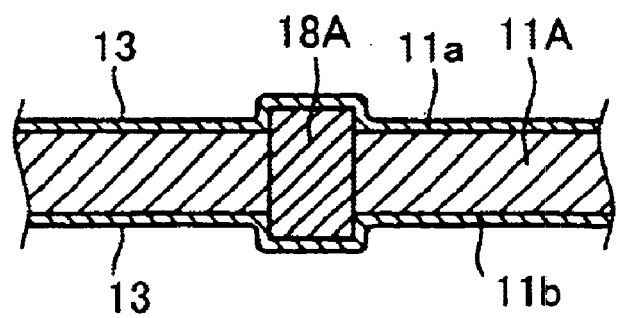
Figures 2, 3, 4, 5, 6, 7, 7C:
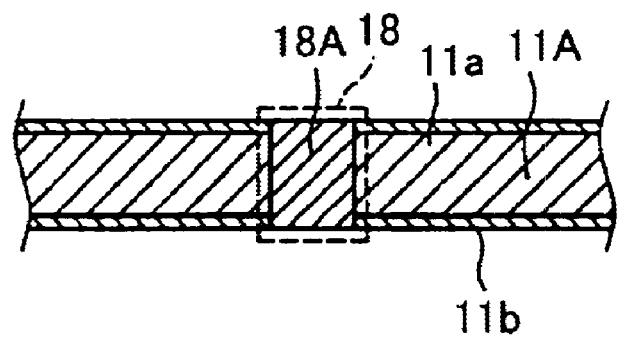
Figures 2, 3, 4, 5, 6, 7, 8:
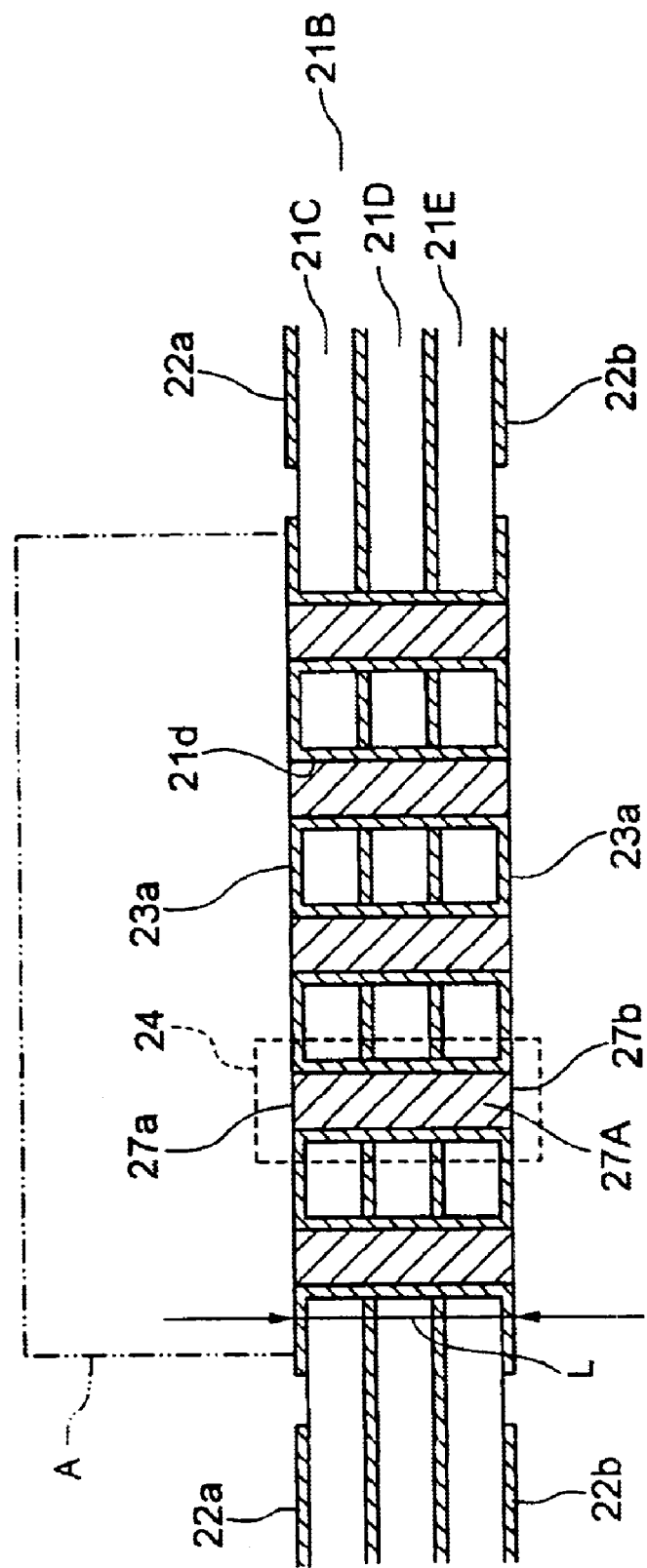
Figures 2, 3, 4, 5, 6, 7, 8, 9:
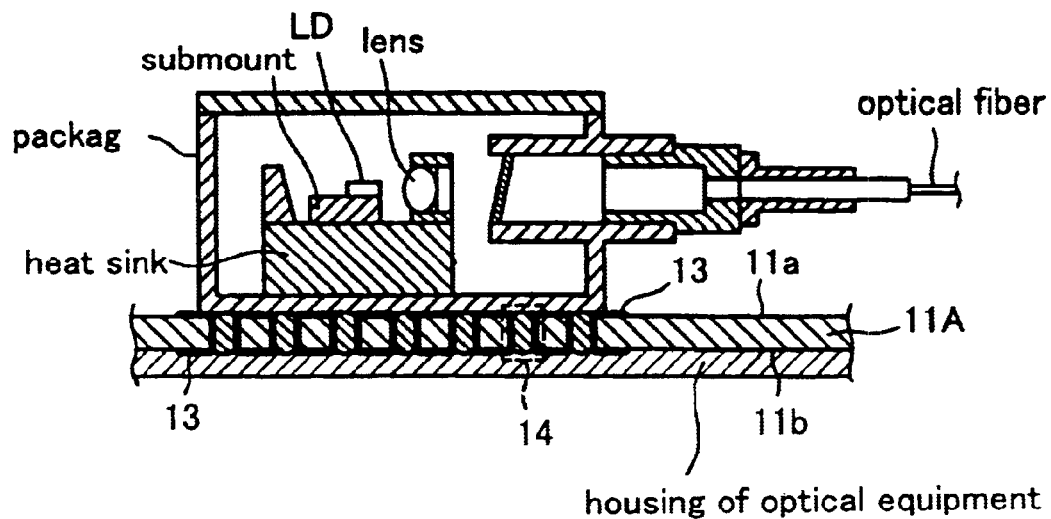
Figures 2, 3, 4, 5, 6, 7, 8, 9, 10:
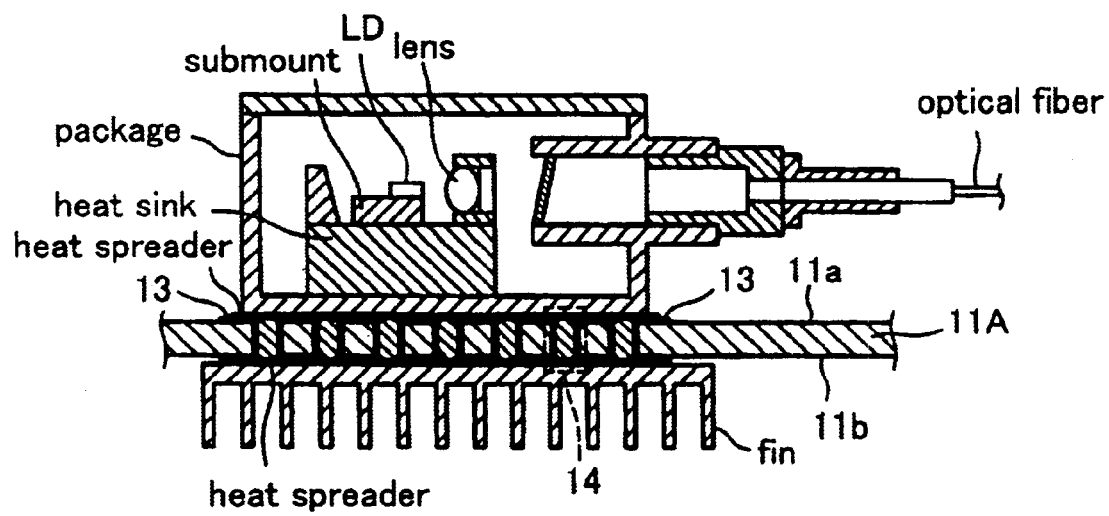

The heat-conducting portion 15 shown in FIG. 2-4 comprises a plating layer 13 formed on an internal surface of a through hole 11c piercing the board 11A from its upper face 11a to a lower face 11b, and a heat-conducting member 15A held within the through hole 11c.

The heat-conducting portion 15 comprises a core body 15a, a plating layer 13 formed on the internal surface of the through hole 11c and a binder 15b interposed at least in their gap.

The core body 15a may be formed of a metal such as aluminum or copper, or a non-metal of high thermal conductivity such as AlN (aluminum nitride) or a composite material such as resin dispersed with fibrous carbon.

The binder 15b may be formed of low melting point metal.

As shown in FIG. 2-4, the binder 15b may cover the upper and lower ends of the core body 15a and may be exposed in the aperture of the through hole 11c, with their upper and lower surfaces being almost coplanarly disposed respectively with the upper and lower surfaces 11a, 11b of the board 11A.

The heat-conducting portions 15 may be formed in the following way. First, like in the case of forming the heat-conducting portions 14, a plurality of through holes 11c are formed on a wiring board 11A, and then the upper and lower surfaces 11a, 11b of the board 11A and internal surfaces of the through holes 11c are plated with a plating layer 13. Thereafter, a plurality of core bodies 15a, each having a smaller diameter than the diameter of the through hole 11c, are fitted within the plurality of through holes 11c. Melt of a low-melting point metal (solder) is poured in each gap between the core body 15a and the plating layer 13 in the through hole 11c, and is cooled there. In the heat-conducting portions 15 thus formed, piercing the board 11A from its upper and lower face, the core body 15a and the surrounding metal are combined to serve as the heat-conducting member 15A.

Note that the core bodies 15a may preferably be plated with Au or Ni in advance in order to ensure wettability of the low melting point metal.

Another example of the heat-conducting portions is shown in FIG. 2-5. In this heat-conducting portion 16, the upper face 11a and lower face 11b of the wiring board 11A and the internal surfaces of the through holes 11c are plated, and then, the heat-conducting member 16A formed of metal of relatively small hardness, such as aluminum or copper, is fitted into each of the holes 11c. The upper end 16a and the lower end 16b of the heat-conducting member 16A are exposed respectively on the upper surface 11a and lower surface 11b of the wiring board 11A.

In the above example of the heat-conducting portions, the plating layer 13 may be omitted.

FIG. 2-6 shows still another example of the heat-conducting portions. In this example, the heat conducting portions 17 is formed by fitting heat-conducting members 17A into the through holes 11c such that the upper ends 17a and lower ends 17b thereof are coplanar respectively with the upper and lower surface 11a, 11b of the board 11A. Then, the plating layers 13 are formed on both surfaces of the board.

Further, the heat-conducting portions may have s different structure, of which the forming process is shown in FIG. 2-7. In the first step of this forming process, the heat-conducting members 18A are fitted into the through holes 11c such that the upper ends 18a and the lower ends 18b project respectively beyond the upper surface 11a and lower surface 11b of the board 11A by an amount equivalent to or larger than a thickness of a plating layer 13 to be formed in subsequent step (see FIG. 2-7A). Then, the plating layer 13 is formed on both surfaces of the board 11A, including both ends and exposed side surface of the heat-conducting members 18A (see FIG. 2-7B). Finally, the projected portions of the heat-conducting members 18A are trimmed and polished until the heat-conducting members 18A are flush with the plating layer 13 (see FIG. 2-7C).

(Second Example of Heat-Conducting Mounting Board)

The more complicated the electric circuits for driving an optical module on a mounting board, the more difficult it will become to make such electric wiring in a single wiring board, and so does it with the wiring board according to the first example. Using multi-layer wiring boards according to a second example described below can be a solution in such cases. Therefore, the second example of the heat-conducting board relates to the multi-layer wiring boards.

As shown in FIG. 2-8, the mounting board 21B of the second example is a multi-layer wiring board which comprises three layers 21C, 21D, 21E sequentially stacked in this order. Like in the wiring board 11A of the first example, on a portion on which an optical module A is to be placed, a plurality of heat conducting members 27A are fitted into a plurality of through holes 21d to form heat-conducting portions 24. In addition, a first heat-conducting layer 23a and a second heat-conducting layer 23b are formed, being in contact with upper ends 27a and lower ends 27b of the heat-conducting members 27A exposed respectively on an upper and lower surface of the multi-layer wiring board.

In the multi-layer wiring board 21B, heat transferred from the optical module A is transmitted from the upper ends 27a of the heat-conducting members 27A to the lower ends 27b thereof, to be eventually dissipated into the air.

Note that the multi-layer wiring board may comprise a greater number of layers. However, since efficiency of heat transfer is nearly inversely proportional to the length L (see FIG. 2-8) of the heat-conducting member 27A, it is preferable that the multi-layer wiring board is thin. Preferably, the thickness of the multi-layer wiring board is in the range of 1 to 5 mm.

The wiring boards 11A and 21B of the above examples can be used to dissipate heat generated by optical modules more efficiently if used with one of the securing members 3A, 3B, 3C, 3D in the manner depicted in FIG. 1-14. However, the wiring boards of the above examples are so efficient in heat dissipation that heat dissipating efficiency may be practically sufficient, if dispensing with the securing member.

The optical module mounted body of such configuration is shown in FIG. 2-9. As shown in FIG. 2-9, an optical module A is placed on a mounting portion of a mounting board 11A(or 21B) formed with the heat-conducting portions 14. The heat transferred from the optical module A is transmitted in a practically efficient manner through the heat-conducting portions 14 to a lower face 11b of the wiring board 11A to be eventually dissipated into the air, whereby the performance of the optical module can be maintained irrespective of its own heat generation.

The optical module mounted body, having an optical module A and a wiring board 11A(or 21B) as described above, may be used in optical equipments in the state that the lower face 11b of the wiring board 11A is fixed directly to an internal surface of a housing of optical equipments (see FIG. 2-9). In this configuration, the mounting board 11A (21B) serves both as a wiring board and an efficient heat sink that dissipates heat to the housing. Therefore the wiring board described herein can be advantageously used to downsize the equipments that utilize optical module mounted body therein.

In another application, as shown in FIG. 2-10, the optical module mounted body may be equipped with fins or other heat sink attached to the lower face 11b of the wiring board 11A.

In the configurations as depicted in FIGS. 2-9 and 2-10, heat-conducting grease, heat-dissipating sheet formed of aluminum, indium alloy or graphite, or heat-spreader may be disposed, if necessary, between the optical module A and the wiring board or between the fins and the wiring board.

Advantages derived from the present invention may include one or more of the following.

According to one or more embodiments of the present invention, an optical module can be fixed in proper contact with the mounting board. Because of this, in the optical module mounted body, heat transferred from the optical module can be efficiently dissipated to outside.

According to one or more embodiments of the present invention, the optical module is not screwed to the mounting board to be fixed. Therefore, the optical module mounted body is immune from undesirable deformation of a securing member, a mounting board or the optical module.

According to one or more embodiments of the present invention, the optical module is fixed with a force worked along a wide range where the engagement portions of the securing member and the lower corner of the through holes are in contact. Hence, in the present invention, the optical module is immune from concentration of strain on any particular portion thereof. Therefore, the optical coupling between the optical semiconductor chip and the optical fiber is not changed.

According to one or more embodiments of the present invention, the optical module is fixed to the mounting board by using a compact and easily attachable/detachable securing member. Therefore, the optical module can be attached to or detached from the mounting board very easily, and it is possible to secure the optical module in a shortened tact time.

According to one or more embodiments of the present invention, the securing member or the optical module does not need a flange for being screwed to the mounting board. Because of this, the optical module mounted body of the present invention occupies less space, and is advantageous in downsizing the equipment using the optical module mounted body.

According to one or more embodiments of the present invention, a mounting board has heat-conducting portions that pierce the board, connecting a surface on which the optical module is placed and the opposite surface from which heat is dissipated. Hence, the heat transferred from the optical module can be efficiently dissipated.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An optical module mounted body comprising:
    a mounting board having a mounting surface with a plurality of holes formed thereon;
    an optical module placed on the mounting surface; and
    a self-securing member configured to secure said optical module to the mounting board, said self-securing member including an upper portion, a plurality of legs extending from the upper portion and a plurality of engagement portions formed at ends of the plurality of legs,
    wherein said optical module is held between said mounting board and said self-securing member such that the upper portion of said self-securing member abuts an opposing surface of said optical module, and
    wherein the plurality of legs are inserted in the plurality of holes, the plurality of engagement portions resiliently engaging with said mounting board to hold said optical module to said mounting board.

2. The optical module mounted body according to claim 1, wherein the plurality of engagement portions engage with said mounting board on an undersurface opposite said mounting surface.

3. The optical module mounted body according to claim 1, wherein said optical module is pressed against the mounting surface by the upper portion of said self-securing member.

4. The optical module mounted body according to claim 1, wherein the upper portion of said self-securing member is convex towards the upper surface.

5. The optical module mounted body according to claim 1,
    wherein said optical module comprises at least one lead pin for electrical connection to external circuits; and
    wherein the at least one lead pin is soldered to said mounting board.

6. The optical module mounted body according to claim 5,
    wherein said mounting board is formed with wiring holes, and
    wherein the at least one lead pin is inserted in the wiring holes and soldered to said mounting board.

7. The optical module mounted body according to claim 1, further comprising a heat conducting member interposed between a bottom surface of said optical module and the mounting surface of said mounting board.

8. The optical module mounted body according to claim 1,
    wherein said mounting board comprises at least one heat conducting member connecting continuously the mounting surface and an undersurface opposite the mounting surface, each end of said at least one heat conducting member being coplanar with each one of the mounting surface and the undersurface.

9. The optical module mounted body according to claim 1, wherein said self-securing member has two legs to oppose each other on both lateral sides of said optical module.

10. The optical module mounted body according to claim 1, wherein said self-securing member has two legs and another leg, the two legs and the another leg opposing on both longitudinal sides of said optical module.

11. The optical module mounted body according to claim 1, wherein said self-securing member has two legs on each lateral side of said optical module.

12. The optical module mounted body according to claim 11, wherein said optical module comprises a plurality of lead pins for electrical connection to external circuits, the plurality of lead pins protruding on both lateral sides of said optical module; and wherein a part of the plurality of lead pins protruding on each lateral side of said optical module are received between the two legs on a same side.

13. A securing method of an optical module comprising:

placing said optical module on a mounting surface of a mounting board;

placing a self-securing member over said optical module, said self-securing member including an upper portion that abuts, an opposing surface of said optical module, a plurality of legs extending from the upper portion generally alongside of said optical module, a plurality of engagement portions being formed at ends of the plurality of legs; and attaching said self-securing member to said mounting board, the plurality of legs being inserted in a plurality of holes formed on said mounting board and the plurality of engagement portions being resiliently engaged with said mounting board.

14. The method according to claim 13, wherein the upper portion of said self-securing member is adapted to press the upper surface of said optical module against the mounting surface.

15. The method according to claim 13, wherein said upper portion of said self-securing member is convex towards said upper surface of said optical module.

16. The method according to claim 13, further comprising:

inserting a lead pin of said optical module in a wiring hole formed on said mounting board; and soldering the lead pin to said mounting board.

* * * * *